(12) United States Patent
Kim et al.

(10) Patent No.: US 11,195,583 B2
(45) Date of Patent: Dec. 7, 2021

(54) STORAGE DEVICE AND ACCESS METHOD THEREOF

(71) Applicant: Samsung Electronics Co., Ltd., Suwon-si (KR)

(72) Inventors: Jihong Kim, Seoul (KR); Kyungduk Lee, Seoul (KR); Young-Seop Shim, Seoul (KR); Kirock Kwon, Hwaseong-si (KR); Myoung Seok Kim, Seoul (KR)

(73) Assignees: SAMSUNG ELECTRONICS CO., LTD., Suwon-si (KR); Seoul National University R&DB Foundation, Seoul (KR)

( * ) Notice: Subject to any disclaimer, the term of this patent is extended or adjusted under 35 U.S.C. 154(b) by 36 days.

(21) Appl. No.: 16/736,881

(22) Filed: Jan. 8, 2020

(65) Prior Publication Data
US 2020/0402580 A1 Dec. 24, 2020

(30) Foreign Application Priority Data

Jun. 18, 2019 (KR) .......................... 10-2019-0072403

(51) Int. Cl.
*G11C 16/04* (2006.01)
*G11C 16/08* (2006.01)
(Continued)

(52) U.S. Cl.
CPC ............ *G11C 16/08* (2013.01); *G06F 3/0604* (2013.01); *G06F 3/0656* (2013.01); *G06F 3/0659* (2013.01); *G06F 3/0679* (2013.01); *G06F 12/0804* (2013.01); *G11C 16/0483* (2013.01); *G11C 16/10* (2013.01); *G11C 16/26* (2013.01); *G11C 16/3459* (2013.01); *G06F 2212/601* (2013.01)

(58) Field of Classification Search
CPC ......... G11C 16/08; G11C 16/10; G11C 16/26; G11C 16/3459
See application file for complete search history.

(56) References Cited

U.S. PATENT DOCUMENTS 7,679,133 B2 3/2010 Son et al.
8,539,138 B2 9/2013 Kim et al.
(Continued)

*Primary Examiner* — Pho M Luu
(74) *Attorney, Agent, or Firm* — Muir Patent Law, PLLC

(57) ABSTRACT

A method of accessing a nonvolatile memory device which includes a memory block where semiconductor layers including word lines are stacked includes receiving a write request for the memory block, determining whether the write request corresponds to one or more leading word lines, programming, in response to the write request determined as corresponding to the leading word lines, memory cells connected thereto in a first program mode, and programming, when the write request is determined as corresponding to a following word line different from the leading word lines, memory cells connected to the following word line in a second program mode. The second program mode is performed with a second program parameter including at least one of a number of program pulses, a number of program verify pulses, a program start voltage, and a program end voltage that is different from a corresponding first parameter of the first program mode.

20 Claims, 20 Drawing Sheets

(51) Int. Cl.
*G11C 16/10* (2006.01)
*G11C 16/34* (2006.01)
*G11C 16/26* (2006.01)
*G06F 3/06* (2006.01)
*G06F 12/0804* (2016.01)

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,570,802 B2 | 10/2013 | Shirakawa |
| 8,654,587 B2 | 2/2014 | Yoon et al. |
| 9,064,545 B2 | 6/2015 | Cho et al. |
| 9,142,302 B2 | 9/2015 | Dong et al. |
| 9,343,156 B1 | 5/2016 | Mui et al. |
| 9,548,124 B1 | 1/2017 | Hazeghi et al. |
| 9,691,478 B1 * | 6/2017 | Lin .................. G11C 13/0023 |
| 9,852,804 B2 | 12/2017 | Park et al. |
| 9,898,364 B2 | 2/2018 | Higgins et al. |
| 9,940,232 B1 * | 4/2018 | Kim ..................... G11C 16/14 |
| 10,014,063 B2 | 7/2018 | Tseng et al. |
| 10,158,380 B2 * | 12/2018 | Sharon ................ G06F 3/0619 |
| 2011/0233648 A1 | 9/2011 | Seol et al. |

* cited by examiner

STORAGE DEVICE AND ACCESS METHOD THEREOF

CROSS-REFERENCE TO RELATED APPLICATIONS

This application claims priority under 35 U.S.C. § 119 to Korean Patent Application No. 10-2019-0072403 filed on Jun. 18, 2019, in the Korean Intellectual Property Office, the disclosures of which are incorporated by reference herein in their entireties.

BACKGROUND

Embodiments of the inventive concept relate to a semiconductor memory device, and in particular, relate to a storage device and an access method thereof.

A flash memory device is being used as voice and image data storage media of information devices such as a computer, a smartphone, a personal digital assistant (PDA), a digital camera, a camcorder, a voice recorder, an MP3 player, and a handheld PC. There is an increasing application of the flash memory device as a storage device. Nowadays, a semiconductor memory device with a three-dimensional array structure is being supplied to increase the degree of integration of the flash memory device.

Cell strings of the flash memory device having the three-dimensional array structure are formed in a direction perpendicular to a substrate. That is, memory cells are provided on the substrate in rows and columns and are stacked in the direction perpendicular to the substrate to form a three-dimensional structure. However, a program, read, or erase characteristic of the memory cells are known as varying depending on where the memory cells are located in the three-dimensional structure.

SUMMARY

Embodiments of the inventive concept provide a storage device that accesses a nonvolatile memory device in consideration of a characteristic of a stacked structure of a memory block and an access method thereof.

According to an exemplary embodiment, a method of accessing a nonvolatile memory device which includes a memory block where a plurality of semiconductor layers including a plurality of word lines are stacked includes receiving a write request for the memory block, determining whether the write request corresponds to one or more leading word line of the plurality of word lines, programming, when the write request is determined as corresponding to the one or more leading word lines, memory cells connected thereto in a first program mode, and programming, when the write request is determined as corresponding to a following word line different from the one or more leading word lines, memory cells connected to the following word line in a second program mode. The second program mode is performed with a second program parameter including at least one of a number of program pulses, a number of program verify pulses, a program start voltage, and a program end voltage that is different from a corresponding first parameter of the first program mode.

According to an exemplary embodiment, a storage device includes a nonvolatile memory device that includes a memory block where a plurality of semiconductor layers are stacked, and a storage controller that classifies and manages a plurality of word lines formed in the plurality of semiconductor layers into one or more leading word lines and a following word line of each of the one or more leading word lines. The storage controller programs memory cells connected to the leading word line in a first program mode, generates a second program parameter from program result information obtained from the programming of the memory cells connected to the leading word line in the first program mode and programs memory cells connected to the following word line in a second program mode with the second program parameter. The second program parameter includes a value obtained by adjusting at least one of a number of program pulses, a number of program verify pulses, a program start voltage, and a program end voltage of a first program parameter used in the first program mode based on the program result information.

According to an exemplary embodiment, a storage device includes a nonvolatile memory device including a memory block with a plurality of semiconductor layers stacked on each other and a storage controller including a word line monitor controlling the nonvolatile memory device such that for an access request to one or more leading word lines of the memory block, memory cells connected thereto are programmed in a first program mode and for an access request to a following word line of each of the one or more leading word lines, memory cells connected thereto are programmed in a second program mode and a second parameter manager generating a second program parameter for the second program mode from program result information provided as a result of executing the first program mode.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
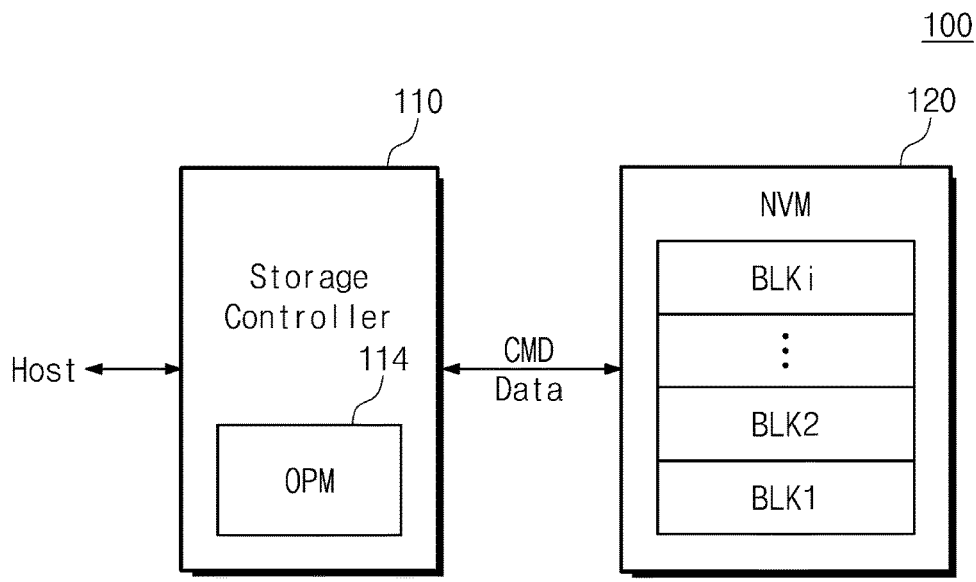
FIG. 1 is a block diagram illustrating a storage device according to an embodiment of the inventive concept.

It should be understood that both the foregoing general description and the following detailed description are provided as examples. Reference numerals will be represented in detail in embodiments of the inventive concept, examples of which are illustrated in the accompanying drawings. Wherever possible, the same reference numerals are used in the drawings and the description to refer to the same or similar parts.

Below, a storage device using a flash memory device will be exemplified to describe features and functions of the inventive concept. However, one skilled in the art may easily understand other merits and performance of the inventive concept depending on the contents disclosed here. The inventive concept may be implemented or applied through other embodiments. In addition, the detailed description may be changed or modified according to the inventive concept and applications without departing from the claims, the scope and spirit, and any other purposes of the inventive concept.

FIG. 1 is a block diagram illustrating a storage device according to an embodiment of the inventive concept. Referring to FIG. 1, a storage device 100 includes a storage controller 110 and a nonvolatile memory device 120. In an embodiment, each of the storage controller 110 and the nonvolatile memory device 120 may be implemented with one chip, one package, or one module. Alternatively, the storage controller 110 and the nonvolatile memory device 120 may be implemented with one chip, one package, or one module so as to constitute a memory system such as a memory card, a memory stick, or a solid state drive (SSD).

The storage controller 110 may be configured to control the nonvolatile memory device 120. For example, depending on a request of a host, the storage controller 110 may write data to the nonvolatile memory device 120 or may read data stored in the nonvolatile memory device 120. For the access to the nonvolatile memory device 120, the storage controller 110 may provide a command, an address, and a control signal to the nonvolatile memory device 120.

In particular, the storage controller 110 includes an optimal parameter manager (OPM) 114. The optimal parameter manager 114 may optimize a program or read parameter in the unit of memory block of the nonvolatile memory device 120 to set an optimal parameter. The optimal parameter manager 114 may manage a program or read parameter depending on a characteristic for each layer (i.e., semiconductor layer) within a three-dimensional memory structure where a cell string is formed in a direction perpendicular to a substrate. In addition, the optimal parameter manager 114 may adjust and manage the parameter for each layer with reference to a temperature or a program/erase count. The optimal parameter may be referred to as a second parameter, the optimal parameter manager 114 may be referred to as a second parameter manager.

In general, in the three-dimensional memory structure, memory cells that are formed at the same layer have similar program or read characteristics. Below, this tendency is called a "horizontal layer similarity". In addition, in the three-dimensional memory structure, a characteristic of layers in a vertical direction has a predictable variability. Below, this tendency is called a "vertical layer variability". Even though there is a difference depending on a process variation, a temperature, or a program/erase count, the vertical layer variability may be predictable with sufficient accuracy, for example, according to a shape of a vertical string around which the memory cells are stacked in a direction perpendicular to a substrate. The vertical string may correspond to a unit of the cell string. In an example embodiment, the vertical string may have an increasing width away from the substrate.

The optimal parameter manager 114 may measure a characteristic of memory cells in a unit of a word line which is present in one layer (i.e., a level) of the nonvolatile memory device 120. One layer includes a plurality of word lines positioned at the same level from the substrate. In an example embodiment, the layer may be separated into multiple layers by a plurality of word line cuts. The multiple layers formed from the same layer may be positioned at the same level from the substrate, and may also be referred to as one layer or the same layer. The optimal parameter manager 114 may determine an optimal access parameter of memory cells of all the word lines included in the same layer by using information about a result of accessing one word line in the same layer. In this case, the horizontal layer similarity is considered. The optimal parameter manager 114 may determine the optimal access parameter of memory cells of a word line included in another layer by using information about a result of accessing one word line. In this case, the vertical layer variability is considered.

A speed at which the access to the remaining memory cells is performed may be improved by using access result information about the memory cells of the word line at one layer. For example, with regard to the remaining memory cells, to skip a program verify pulse or to decrease the maximum number of loops is possible in a program operation using the horizontal layer similarity. In addition, it is possible to optimize an access parameter for memory cells of all the layers by using the vertical layer variability. How the optimal parameter manager 114 detects and adjusts a parameter will be more fully described with reference to drawings below.

Under control of the storage controller 110, the nonvolatile memory device 120 may store data received from the storage controller 110 or may send data stored therein to the storage controller 110. The nonvolatile memory device 120 may include a plurality of memory blocks BLK1 to BLKi. Each of the plurality of memory blocks BLK1 to BLKi may include a three-dimensional memory structure in which word line layers are stacked in a direction perpendicular to a substrate. The plurality of memory blocks BLK1 to BLKi may be managed by the storage controller 110 by using wear-leveling information such as a program/erase count. The nonvolatile memory device 120 may provide an access parameter of memory cells of a word line in a selected memory block depending on a request of the storage controller 110.

As described above, according to an embodiment of the inventive concept, the storage device 100 may access memory cells by using an access parameter determined depending on a characteristic of each layer in a three-dimensional memory structure. That is, the storage device 100 may obtain the optimal access parameter through an access to memory cells of one word line and may perform an access to the remaining memory cells depending on the optimal access parameter. In this case, it may be possible to decrease a program time or a read time without the reduction of reliability of memory cells. Accordingly, according to the storage device 100 of the inventive concept, the performance of storage may be improved without the reduction of reliability of stored data.

Figure 2:
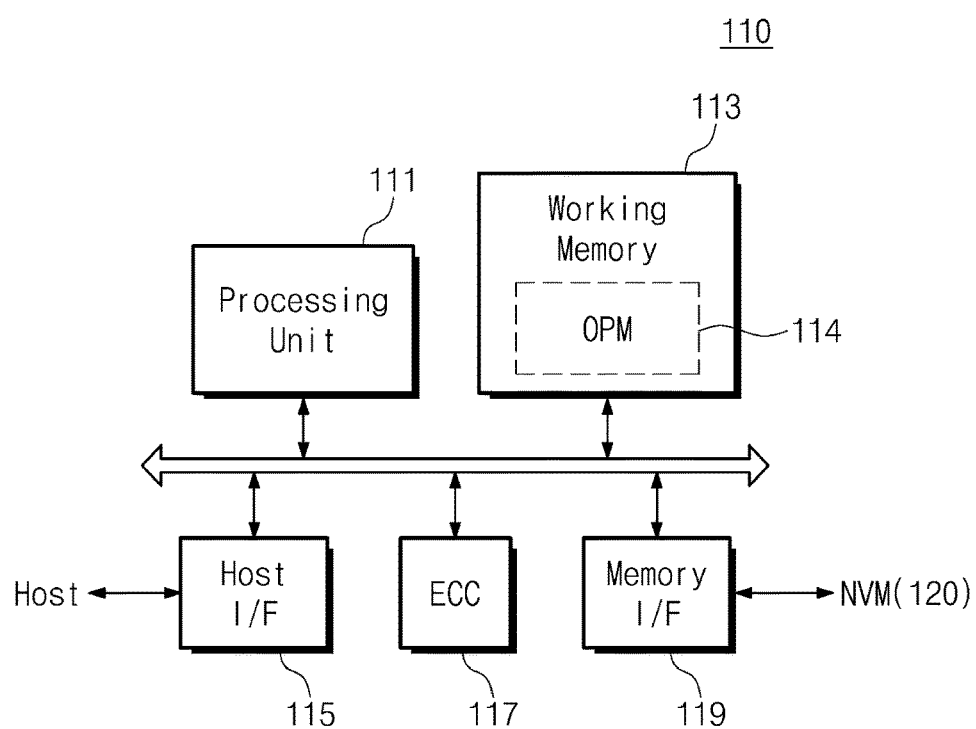
FIG. 2 is a block diagram illustrating a configuration of a storage controller of FIG. 1.

FIG. 2 is a block diagram illustrating a configuration of a storage controller of FIG. 1. Referring to FIG. 2, the storage controller 110 according to an embodiment of the inventive concept includes a processing unit 111, a working memory 113, a host interface 115, an error correction code circuit 117, and a memory interface 119. However, the present inventive concept is not limited to the aforementioned components. For example, the storage controller 110 may further include a read only memory (ROM) that stores code data necessary for an initial booting operation.

The processing unit 111 may include a central processing unit (CPU) or a micro-processor. The processing unit 111 may manage overall operations of the storage controller 110. The processing unit 111 may drive firmware for operating the storage controller 110.

Software (or firmware) for controlling the storage controller 110 or data may be loaded onto the working memory 113. The stored software and data may be driven or processed by the processing unit 111. According to an embodiment of the inventive concept, the optimal parameter manager 114 may be loaded onto the working memory 113. Although not illustrated in FIG. 2, the optimal parameter manager 114 may be implemented as a portion of the flash translation layer (FTL).

The optimal parameter manager 114 may be provided with access result information of at least one word line (hereinafter referred to as a "leading word line") from the nonvolatile memory device 120. The optimal parameter manager 114 may generate the optimal access parameter from the access result information in consideration of the horizontal layer similarity or the vertical layer variability. Afterwards, the optimal access parameter may be used to access memory cells corresponding to the remaining word lines (hereinafter referred to as a "following word line") of the selected memory block.

The host interface 115 may provide an interface between a host and the storage controller 110. The host and the storage controller 110 may be connected through one of various standardized interfaces. Here, the standardized interfaces may include an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI Express (PCI-E) interface, a universal serial bus (USB) interface, an IEEE 1394 interface, a universal flash store (UFS) interface, a card interface, and the like.

The error correction code circuit 117 may correct an error of data damaged due to various causes. For example, the error correction code circuit 117 may perform an operation for detecting and correcting an error of data read from the nonvolatile memory device 120. In particular, the error correction code circuit 117 may detect the number of error bits or a bit error rate of data read from memory cells of a word line depending on a request of the optimal parameter manager 114. The detected bit error rate BER may be provided to the optimal parameter manager 114.

The memory interface 119 may provide an interface between the storage controller 110 and the nonvolatile memory device 120. For example, data processed by the processing unit 111 may be stored in the nonvolatile memory device 120 through the memory interface 119. As another example, data stored in the nonvolatile memory device 120 may be provided to the processing unit 111 through the memory interface 119.

The components of the storage controller 110 are described above. An access parameter of each memory block may be adjusted by the storage controller 110 of the inventive concept in consideration of the horizontal layer similarity or the vertical layer variability. Accordingly, a program speed or a read speed of the storage device 100 may be improved without the reduction of reliability of data.

Figure 3:
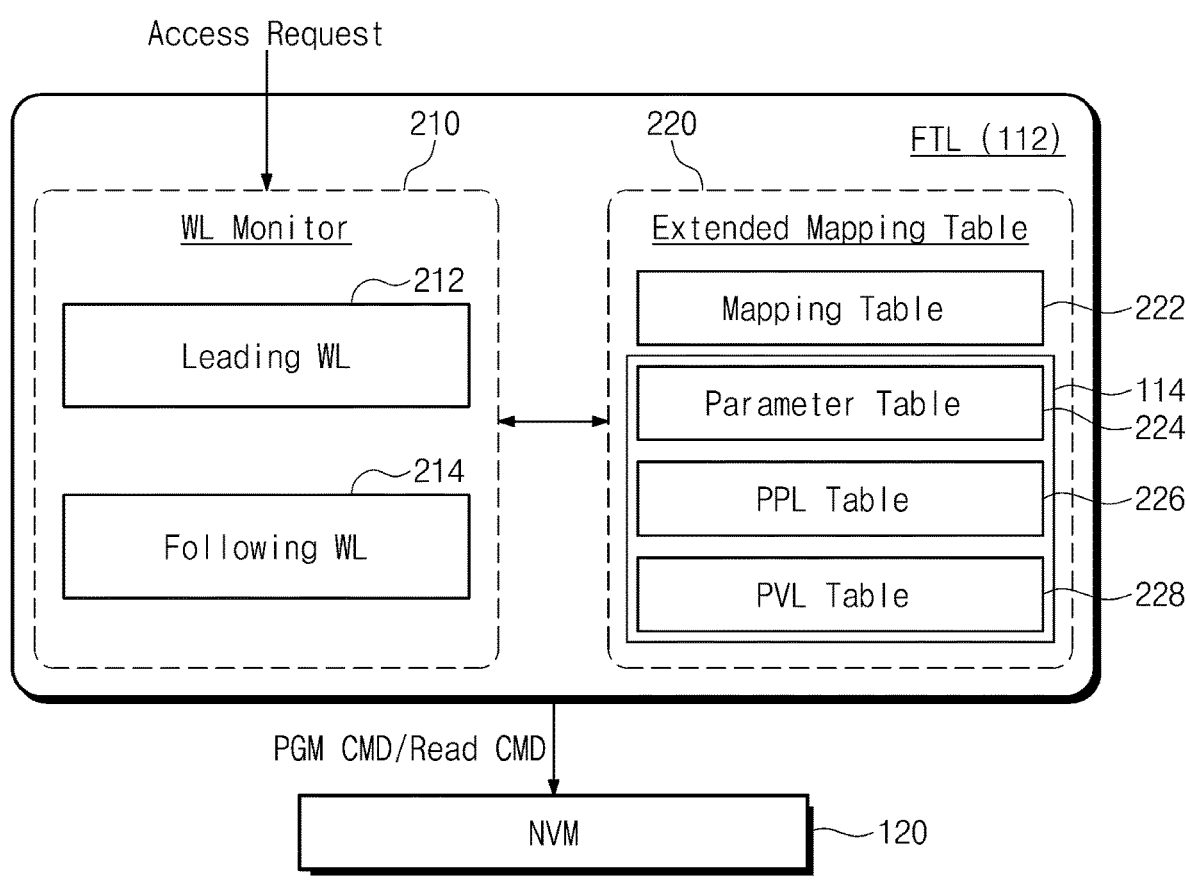
FIG. 3 is a block diagram illustrating a structure of a flash translation layer according to an embodiment of the inventive concept.

FIG. 3 is a block diagram illustrating a structure of a flash translation layer (FTL) according to an embodiment of the inventive concept. Referring to FIG. 3, a flash translation layer 112 of the storage controller 110 may generate a program command/read command for accessing the nonvolatile memory device 120 in response to an access request from the host. The flash translation layer 112 that drives the storage controller 110 may include a word line monitor 210 and an extended mapping table 220. The optimal parameter manager 114 described with reference to FIGS. 1 and 2 may be implemented as a portion of the extended mapping table 220.

The flash translation layer 112 may be firmware that is loaded onto the working memory 113 and may be called and driven by the processing unit 111. The flash translation layer 112 may provide interfacing for hiding an erase operation of the nonvolatile memory device 120 between a file system of the host and the nonvolatile memory device 120.

In general, the flash translation layer 112 may perform functions such as an address mapping function, a garbage collection function, and a wear-leveling function. The address mapping function refers to a function of mapping a logical address provided from the host onto a physical address of the nonvolatile memory device 120. For the address mapping, the flash translation layer 112 may generate and update a mapping table 222. The garbage collection function refers to a function for securing a free block (or an active block) to be provided depending on a write request. The wear-leveling function refers to a function for extending a lifetime of the nonvolatile memory device 120 by managing program/erase counts of memory blocks uniformly.

The flash translation layer 112 of the inventive concept may improve the performance of the storage device 100 by using the word line monitor 210 and the extended mapping table 220 including the optimal parameter manager 114.

The word line monitor 210 may monitor an access request from the host. The word line monitor 210 may determine whether access-requested memory cells are associated with a leading word line or a following word line of a selected memory block. For example, the word line monitor 210 may identify whether an address provided together with the access request corresponds to a leading word line 212 of a memory block of the nonvolatile memory device 120 or corresponds to a following word line 214 thereof. The leading word line 212 indicates a word line of a memory block, which is first accessed depending on a defined access sequence. For example, the leading word line 212 may be a word line that is selected by a first string selection line SSL1 and is placed at the lowermost layer of the selected memory block. In contrast, the following word line 214 may correspond to the remaining word lines other than the leading word line 212 placed at the lowermost layer.

The extended mapping table 220 may include the mapping table 222, a parameter table 224, a program pulse level (PPL) table 226, and a program verify level (PVL) table 227. The mapping table 222 may provide an address managing function being a unique function of the flash translation layer 112. The mapping table 222 may map a logical address generated by a file system of the host onto a physical address of the nonvolatile memory device 120.

The parameter table 224, the PPL table 226, and the PVL table 228 are included in the optimal parameter manager 114 of the inventive concept. The optimal access parameter of memory cells corresponding to the leading word line 212 or the following word line 214 is stored in the parameter table 224. The optimal access parameter of the remaining memory cells in the same layer or the optimal access parameter of memory cells in another layer may be generated from access result information obtained through the access to the memory cells corresponding to the leading word line 212. The optimal access parameter may be stored in the parameter table 224 and is used in a next access operation for the following word line 214.

The optimal access parameter associated with a program pulse level of memory cells corresponding to the leading word line 212 or the following word line 214 may be stored in the PPL table 226. The access result information is obtained through the access to the leading word line 212. An optimal value of a program pulse level of memory cells connected to following word lines may be determined by using the access result information. The optimal access parameter of memory cells of the following word line 214 present in a different layer from the leading word line 212 may be set by using a layer offset. The layer offset is a setting value to which the vertical layer variability is applied. In an example embodiment, the layer offset may be determined based on the change in the shape (e.g., width) of a vertical string PL of FIG. 5.

The optimal access parameter associated with a program verify level of memory cells corresponding to the leading word line 212 or the following word line 214 may be stored in the PVL table 228. The access result information may be obtained through the access to the leading word line 212. The optimal access parameter that is associated with the program verify level of the following word line 214 may be generated from the obtained access result information.

A function of the flash translation layer 112 of the inventive concept is described above as a function module. The flash translation layer 112 as the function module may be implemented with various software modules, hardware components or a combination thereof.

Figure 4:
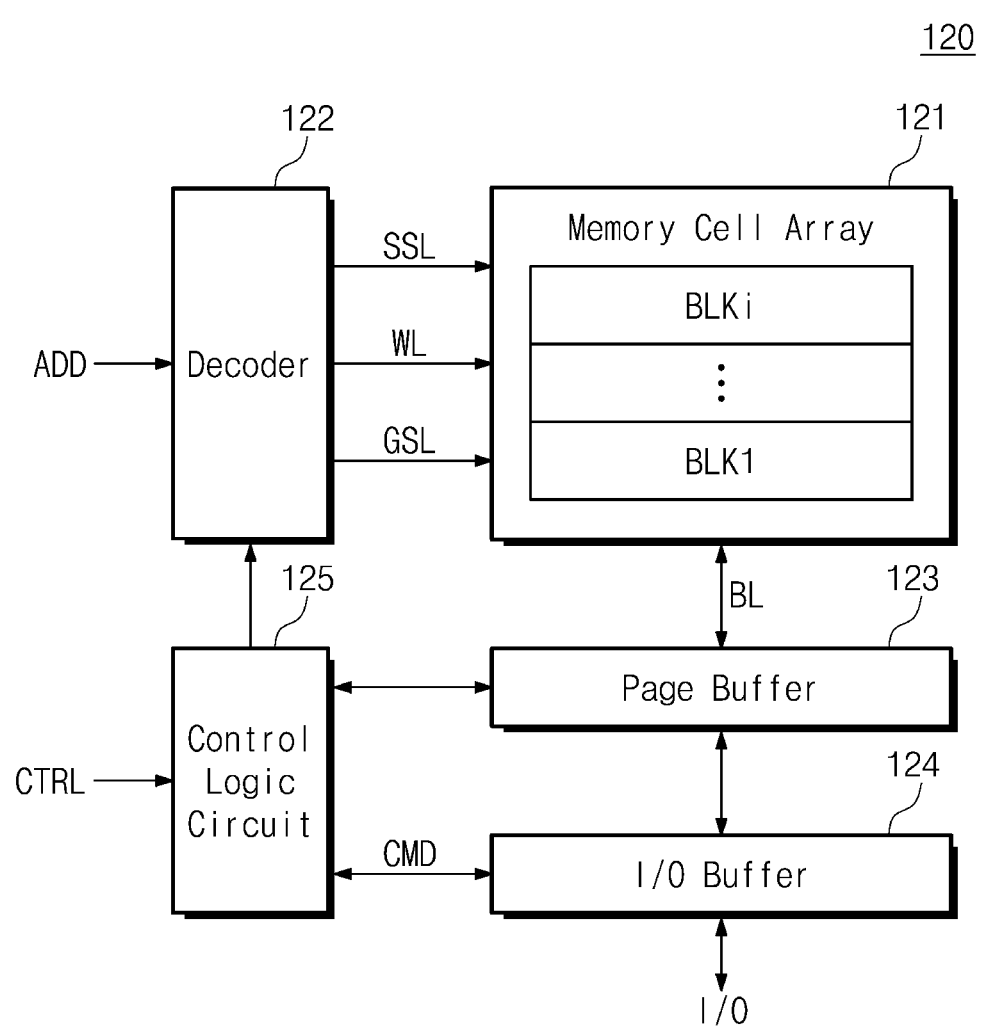
FIG. 4 is a block diagram illustrating a nonvolatile memory device according to an embodiment of the inventive concept.

FIG. 4 is a block diagram illustrating a nonvolatile memory device according to an embodiment of the inventive concept. Referring to FIG. 4, the nonvolatile memory device 120 includes a cell array 121, a decoder 122, a page buffer 123, an input/output buffer 124, and a control logic circuit 125.

The cell array 121 is connected to the decoder 122 through word lines WL and selection lines SSL and GSL. The cell array 121 is connected to the page buffer 123 through bit lines BL. The cell array 121 includes the plurality of memory blocks BLK1 to BLKi. Each of the memory blocks BLK1 to BLKi includes a plurality of NAND cell strings. Data may be written in the cell array 121 in the unit of a page. An erase operation may be performed in the unit of a memory block.

According to an embodiment of the inventive concept, the cell array 121 may be implemented with a three-dimensional (3D) memory array. The 3-dimensional memory array may be monolithically formed in one or more physical level(s) of a memory cell array having an active area arranged on a circuit related on a silicon substrate and an operation of memory cells.

In an embodiment of the inventive concept, the 3D memory array may include vertical NAND strings that are vertically oriented such that at least one memory cell is located over another memory cell. The at least one memory cell may include a charge trap layer. Each vertical NAND string may include at least one selection transistor located over memory cells. At least one selection transistor may have the same structure as those of memory cells and may be monolithically formed together with memory cells.

The decoder 122 may select one of the memory blocks BLK1 to BLKi of the cell array 121 in response to an address ADD. The decoder 122 may provide a word line voltage corresponding to an operating mode to a word line of a selected memory block. The decoder 122 may provide selection signals to the selection lines SSL and GSL to select a memory block. In a read operation, a read voltage may be applied to a selected word line of the selected memory block. In the read operation, a pass read voltage may be applied to unselected word lines of the selected memory block.

The page buffer 123 may operate as a write driver or a sense amplifier based on an operating mode. In a program operation, the page buffer 123 may supply, to a bit line of the cell array 121, a bit line voltage corresponding to data to be programmed. In the read operation, the page buffer 123 may sense data stored in a selected memory cell through a bit line. The page buffer 123 may latch the sensed data and output the latched data to the external.

The input/output buffer 124 may provide write data received in the program operation to the page buffer 123. The input/output buffer 124 may output data provided from the page buffer 123 to the outside in the read operation. The input/output buffer 124 may send the received address or the received command to the control logic circuit 125 or the decoder 122.

The control logic circuit 125 may control the decoder 122 and the page buffer 123 in response to a command CMD or a control signal CTRL. The control logic circuit 125 may control the decoder 122 such that various bias voltages are generated depending on a program command. In particular, the control logic circuit 125 may output program result information depending on a request from the storage controller 110. For example, after the program operation is performed on memory cells corresponding to the leading word line 212, the control logic circuit 125 may output the program result information in response to a get feature request from the storage controller 110.

Figure 5:
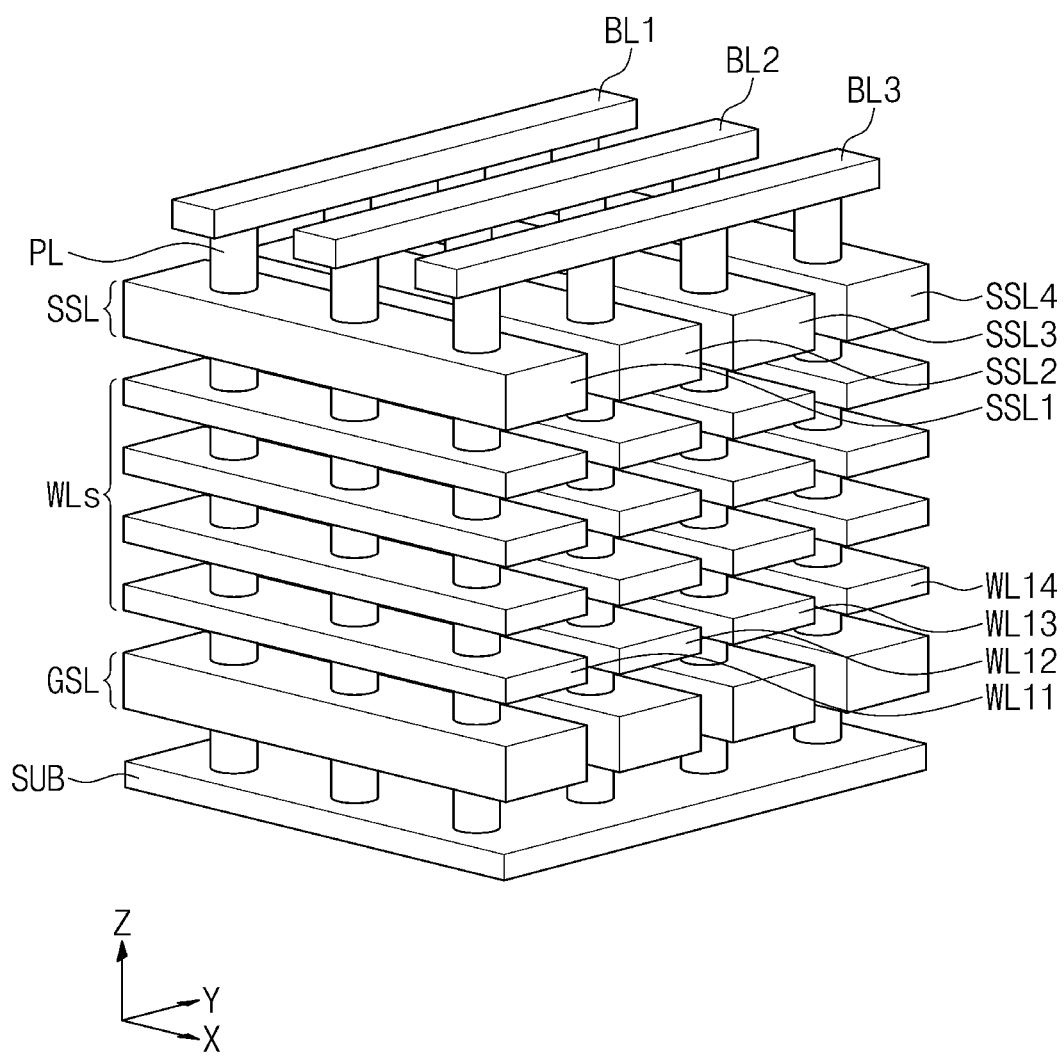
FIG. 5 is a perspective view of a memory block included in a cell array of FIG. 4.

FIG. 5 is a perspective view of the memory block BLKi included in a cell array of FIG. 4. A description will be given with reference to FIG. 5 under the assumption that the memory block BLKi includes 6 layers formed between a substrate SUB and bit lines BL1 to BL3. The bit lines BL1 to BL3 may correspond to conductive materials extending in a Y-direction, respectively.

The memory block BLKi includes layers where ground selection lines GSL, word lines WL, and string selection lines SSL1 to SSL4 are formed between the substrate SUB and the bit lines BL1 to BL3. Memory cells selected by each of the string selection lines SSL1 to SSL4 may be called a "sub-block". In the example of FIG. 5, the memory block BLKi may include 4 sub-blocks.

Each of the sub-blocks is formed on the substrate SUB by stacking at least one ground selection line GSL, a plurality of word lines WL in the shape of a plate between word line cuts, and at least one string selection line SSL in the shape of a plate between string selection line (SSL) cuts. Meanwhile, the memory block BLKi may include SSL cuts for separating the string selection lines SSL. However, the inventive concept is not limited to the above structure of the memory block BLKi. In an example embodiment, the memory block BLKi of the inventive concept may be formed to include a plurality of string selection lines without the SSL cuts.

In the structure that is illustrated in FIG. 5, a plurality of word lines are formed in one layer. For example, a plurality of word lines WL11, WL12, WL13, and WL14 are on or above the ground selection lines GSL. Memory cells formed by the plurality of word lines WL11, WL12, WL13, and WL14 present in the same layer (i.e., the same level from the substrate SUB) have substantially similar cell characteristics. The word lines WL11, WL12, WL13 and WL14 may be formed of a semiconductor layer separated into four layers using the word line cuts. The word lines WL11, WL12, WL13 and WL14 may be referred to as being in the same level or in the same semiconductor layer. Below, having the substantially similar cell characteristics may be called the "horizontal layer similarity" described above. The word line WL11 selected by the string selection line SSL1 from among the plurality of word lines WL11, WL12, WL13, and WL14 may be a leading word line. In the case where the word line WL11 is the leading word line, the word lines WL12, WL13, and WL14 may be the following word lines. An optimal parameter for the word lines WL12, WL13, and WL14 may be generated from a characteristic parameter obtained through a program operation associated with the memory cells corresponding to the word line WL11. The optimal parameter may be referred to as a second parameter.

A plurality of vertical strings PL may penetrate the plurality of word lines, the string selection lines SSL and the ground selection lines GSL. Each of the vertical strings PL may correspond to the cell string. Each of the vertical strings may include an active region to form a transistor with the string selection lines SSL or the ground selection lines GSL or an active region to form memory cells with the word lines. In an example embodiment, each of the vertical strings PL may have a predetermined aspect ratio with increasing widths at higher levels from the substrate SUB.

In an embodiment, an optimal parameter for memory cells present in other layers different from the layer in which the leading word line is formed may be calculated from program result information obtained through the program operation associated with the memory cell corresponding to the leading word line WL11. In an example embodiment, the other layers may be positioned at different levels from that of the leading word line WL11. For example, the other layers may be positioned higher than the layer of the leading word line WL11. This characteristic may come from the vertical layer variability of a three-dimensional memory cell array.

Figure 6:
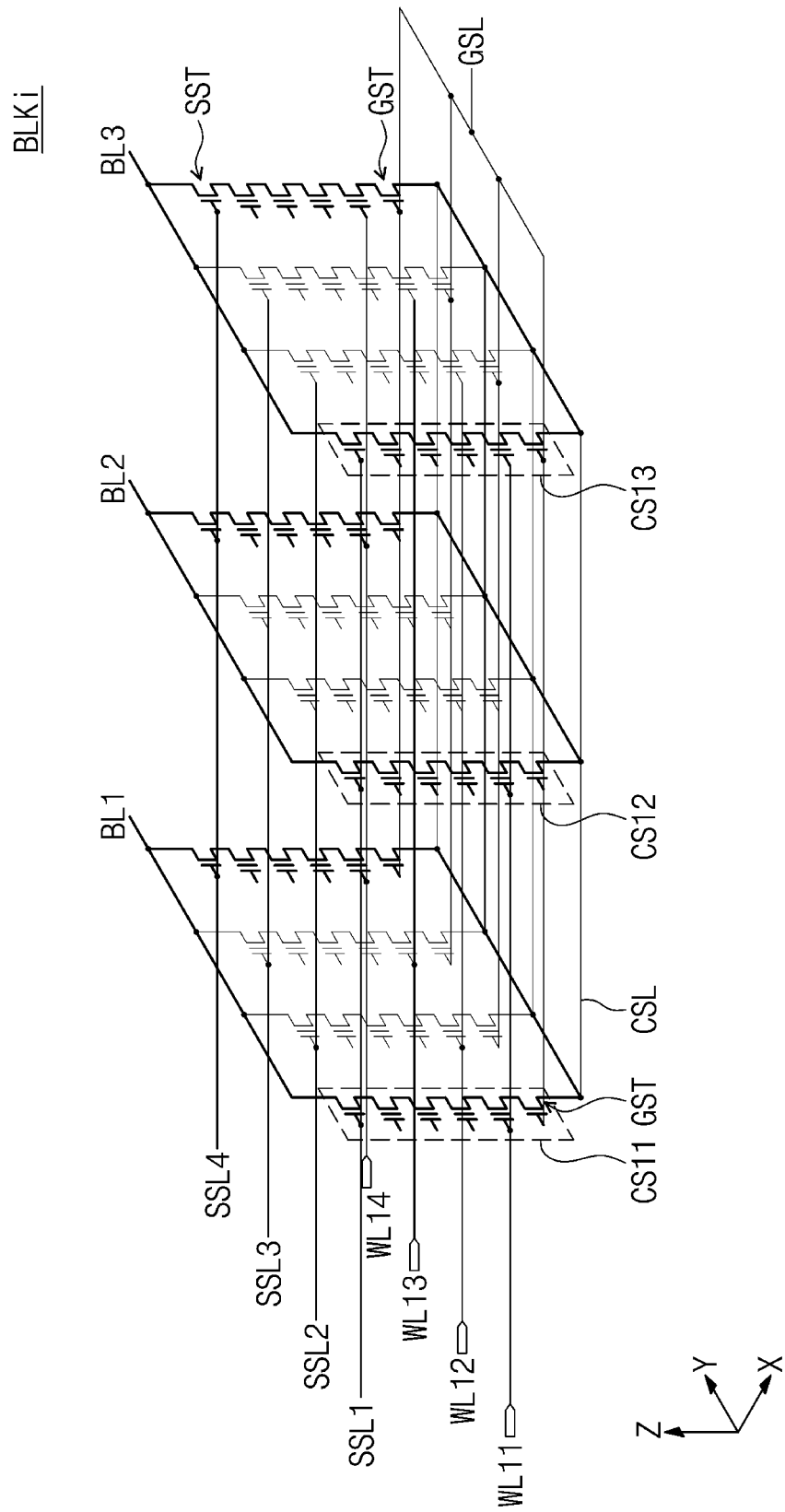
FIG. 6 illustrates a circuit diagram of a memory block of FIG. 5.

FIG. 6 illustrates a circuit diagram of the memory block BLKi of FIG. 5. Referring to FIGS. 5 and 6, cell strings are formed between the bit lines BL1, BL2, and BL3 and a common source line CSL.

A first cell string CS11 is formed between the first bit line BL1 and the common source line CSL. A second cell string CS12 is formed between the second bit line BL2 and the common source line CSL. A third cell string CS13 is formed between the third bit line BL3 and the common source line CSL.

In each cell string, a string selection transistor SST is connected with a corresponding bit line. In each cell string, a ground selection transistor GST is connected with the common source line CSL. In each cell string, memory cells are provided between the string selection transistor SST and the ground selection transistor GST.

Cell strings connected to one string selection line may constitute one sub-block. For example, the cell strings CS11 to CS13 connected to the first string selection line SSL1 may constitute a first sub-block. Cell strings connected to the second string selection line SSL2 may constitute a second sub-block. Cell strings connected to the third string selection line SSL3 may constitute a third sub-block. Cell strings connected to the fourth string selection line SSL4 may constitute a fourth sub-block.

Each cell string includes the ground selection transistor GST. The ground selection transistors GST of the cell strings may be controlled by one ground selection line GSL. Alternatively, although not illustrated in FIG. 6, cell strings corresponding to each row may be controlled by a different ground selection line.

A circuit structure of memory cells included in one memory block BLKi is briefly described above. However, the circuit structure illustrated in FIG. 6 is only a structure schematically illustrated for convenience of description. The present inventive concept is not limited to the example illustrated in FIG. 6. In an example embodiment, one memory block BLKi may include more semiconductor layers, more bit lines, and more string selection lines SSL.

Figure 7:
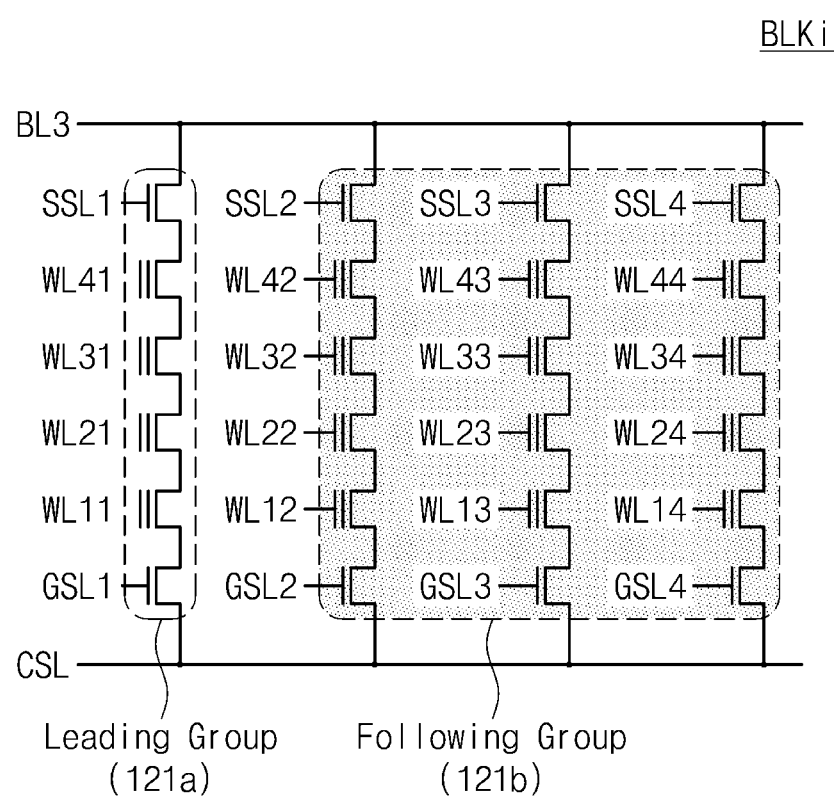
FIG. 7 is a circuit diagram illustrating a shape of a memory block of FIG. 6, which is viewed in an X-direction.

FIG. 7 is a circuit diagram illustrating a shape of a memory block of FIG. 6, which is viewed in an X-direction. Referring to FIG. 7, strings or memory cells constituting the memory block BLKi may be divided into a plurality of groups depending on string selection lines SSLj (j being 1, 2, 3, and 4).

A leading group 121a includes memory cells that are selected by the string selection line SSL1. The leading group 121a is defined under the assumption that memory cells therein are first selected by the string selection line SSL1 for each layer. That is, in a program sequence, it is assumed that word lines WL11, WL21, WL31, and WL41 of word lines of respective layers are first selected. In this case, program result information may be extracted when there are programmed memory cells connected to the word lines WL11, WL21, WL31, and WL41 from among the memory cells of the respective layers. An optimal program parameter that is generated based on the program result information may be applied to a program operation associated with the remaining word lines. Accordingly, a speed at which memory cells of a following group 121b are programmed may be relatively improved.

Here, a way to select the leading group 121a may be variously changed depending on embodiments. For example, in one memory block BLKi, only one word line WL11 may be designated as the leading group 121a, and the remaining word lines may be designated as the following group 121b.

Figure 8:
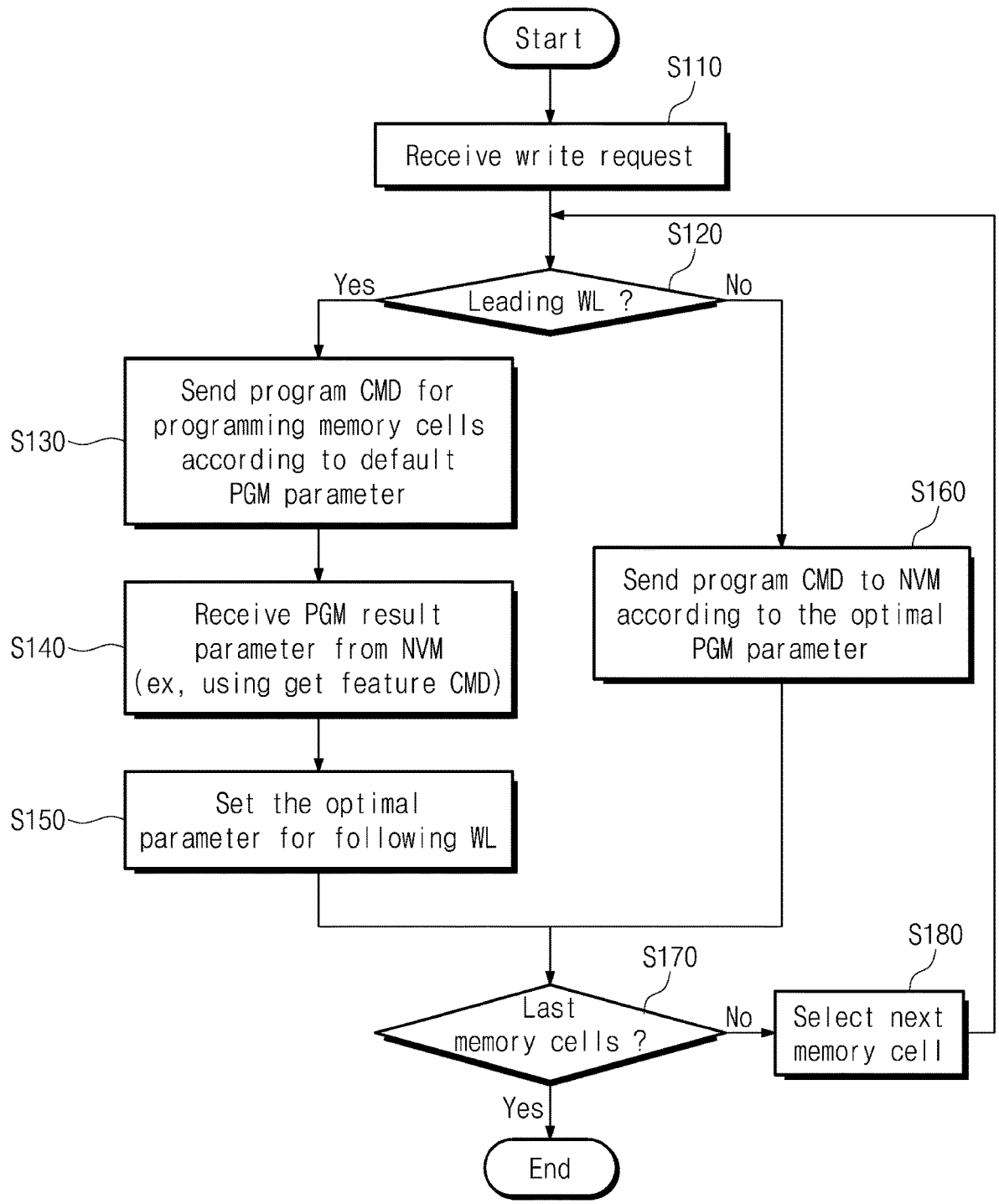
FIG. 8 is a flowchart illustrating an operation of a memory controller according to an embodiment of the inventive concept.

FIG. 8 is a flowchart illustrating an operation of a memory controller according to an embodiment of the inventive concept. Referring to FIG. 8, a storage controller 110 may perform a write operation differently depending on whether a write request is associated with a leading word line of a selected memory block.

When a write request is generated from the host, in operation S110, the storage controller 110 receives an address and data associated with the write request. Here, the write request is provided from the host. However, the inventive concept is not limited to the case where the write request is generated from the host. The write request may be generated by an internal operation (e.g., a garbage collection operation or a metadata update operation) of the storage controller 110.

In operation S120, the storage controller 110 selects a memory block, in which the data are to be written, depending on the received address. The storage controller 110 selects a word line of the selected memory block. In this case, the storage controller 110 determines whether the word line selected depending on the write request is the leading word line 212 (refer to FIG. 3) or the following word line 214. This determination may be made by the word line monitor 210 included in the flash translation layer 112 of the storage controller 110. When the selected word line is the leading word line 212 (Yes), the procedure proceeds to operation S130. When the selected word line is not the leading word line 212 (No), the procedure proceeds to operation S160.

In operation S130, the storage controller 110 sends a program command to the nonvolatile memory device 120 such that the write-requested data are programmed in memory cells connected to the selected leading word line 212. In this case, the storage controller 110 may control the nonvolatile memory device 120 such that the selected memory cells are programmed depending on a default program parameter of a default program parameter. The default program parameter may be referred to a first program parameter and the default program mode may be referred to as a first program mode.

In operation S140, the storage controller 110 may receive program result information of the memory cells from the nonvolatile memory device 120. For example, the storage controller 110 may receive the program result information of the memory cells corresponding to the leading word line 212 by using a get feature command. The program result information may include information about the number of programmed memory cells, threshold voltages of which are a verify voltage or greater, for each program loop. Alternatively, the program result information may include information about the number of program loops in which the number of programmed memory cells, threshold voltages of which are a verify voltage or greater, exceeds a threshold value TH. In addition, the program result information may include the number of passed program loops for each target state. However, the program result information of the present inventive concept is not limited to the above example.

In operation S150, the storage controller 110 determines an optimal parameter of memory cells connected to the following word line 214 based on the obtained program result information. The optimal parameter may be determined by the optimal parameter manager 114 included in the flash translation layer 112. The optimal parameter manager 114 may adjust a default parameter (or a first parameter), such as a verify voltage level, a program start voltage, or a program end voltage to set an optimal parameter (or a second parameter), which is necessary to program memory cells connected to the following word line 214. Here, the following word line 214 may include word lines of the same layer as the leading word line 212 or may include word lines of another layer. In the case where the following word line 214 includes word lines of a different layer from the leading word line 212, a layer offset may be applied.

In operation S160, the storage controller 110 sends a program command to the nonvolatile memory device 120 such that the write-requested data are programmed in memory cells connected to the selected following word line 214. It is assumed that the optimal program parameter for programming the memory cells connected to the following word line 214 is already updated in the parameter table 224 (refer to FIG. 3). Accordingly, the storage controller 110 may control the nonvolatile memory device 120 such that the selected memory cells are programmed depending on the optimal program parameter. To set the optimal program parameter to the nonvolatile memory device 120, for example, a set feature command may be used.

In operation S170, whether the already programmed memory cells are the last memory cells of the selected memory block is determined. When memory cells to be programmed are present in the selected memory block (No), the procedure proceeds to operation S180 for selecting new memory cells. In contrast, when memory cells to be programmed are absent from the selected memory block (Yes), the program procedure associated with the selected memory block is terminated.

A method of programming memory cells connected to the leading word line 212 or the following word line 214 is briefly described above. The leading word line 212 or the following word line 214 may be selected in consideration of a program sequence of a memory block.

Figure 9:
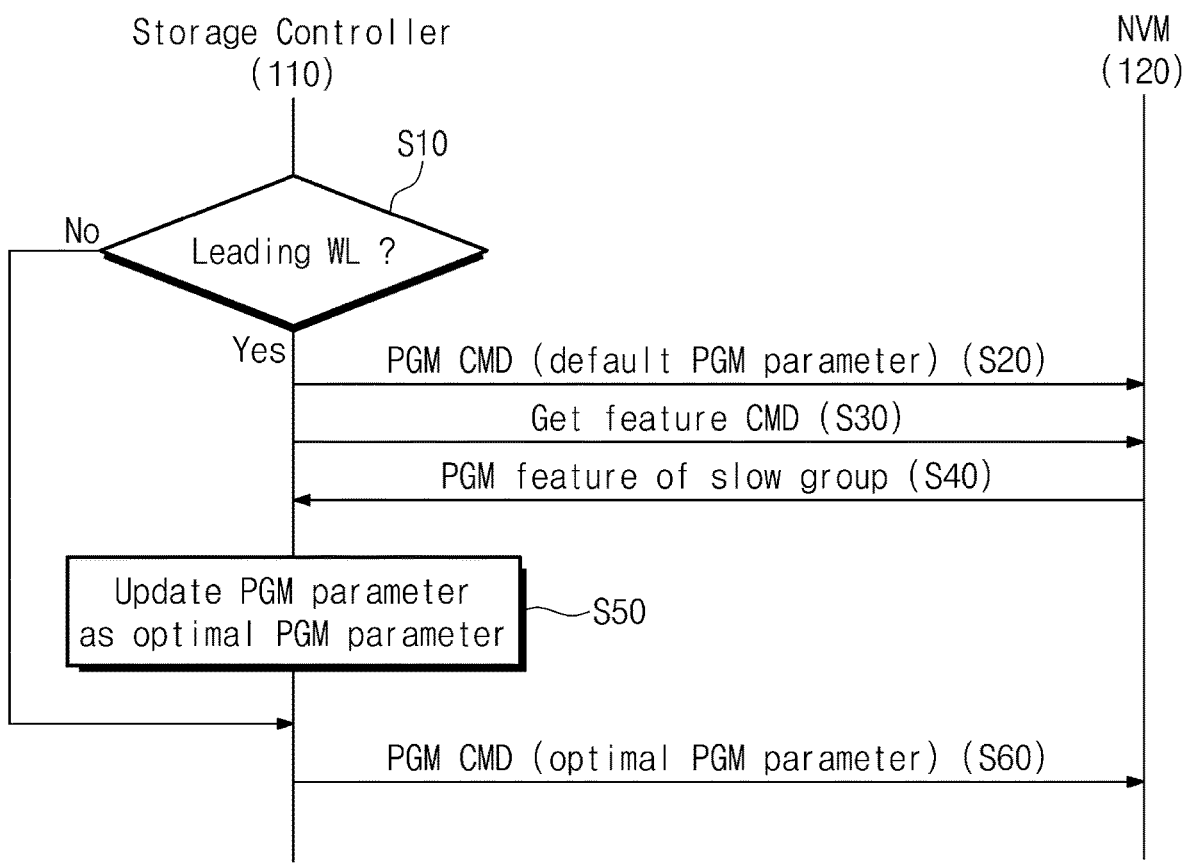
FIG. 9 is a diagram illustrating commands or data that are exchanged between a memory controller and a nonvolatile memory device in compliance with a program procedure of FIG. 8.

FIG. 9 is a diagram illustrating commands or data that are exchanged between a memory controller and a nonvolatile memory device in compliance with a program procedure of FIG. 8. Referring to FIG. 9, the storage controller 110 and the nonvolatile memory device 120 perform a program operation by using a different program parameter depending on a kind of a selected word line.

In operation S10, the storage controller 110 determines whether selected memory cells are included in a leading word line. When it is determined that the selected memory cells are included in the leading word line, the procedure proceeds to operation S20. When it is determined that the selected memory cells are not included in the leading word line, the procedure proceed to operation S60.

In operation S20, the storage controller 110 sends a program command to the nonvolatile memory device 120 such that the selected memory cells are programmed depending on the default program parameter. The nonvolatile memory device 120 may program the selected memory cells depending on the default program parameter determined in advance. When the program operation is completed, the nonvolatile memory device 120 may notify the storage controller 110 to complete the command.

In operation S30, the storage controller 110 sends the get feature command to the nonvolatile memory device 120 for the purpose of obtaining program result information.

In operation S40, the nonvolatile memory device 120 may send the program result information to the storage controller 110 in response to the get feature command.

In operation S50, the storage controller 110 may determine an optimal program parameter for programming memory cells corresponding to a following word line with reference to the program result information. The optimal program parameter may be determined and updated by the optimal parameter manager 114 included in the flash translation layer 112. [Stop Here]

In operation S60, the storage controller 110 sends a program command to the nonvolatile memory device 120 such that the selected memory cells are programmed based on the set optimal program parameter. To set the optimal program parameter to the nonvolatile memory device 120, for example, the set feature command may be used. In this case, the selected memory cells are memory cells connected to the following word line.

Figure 10:
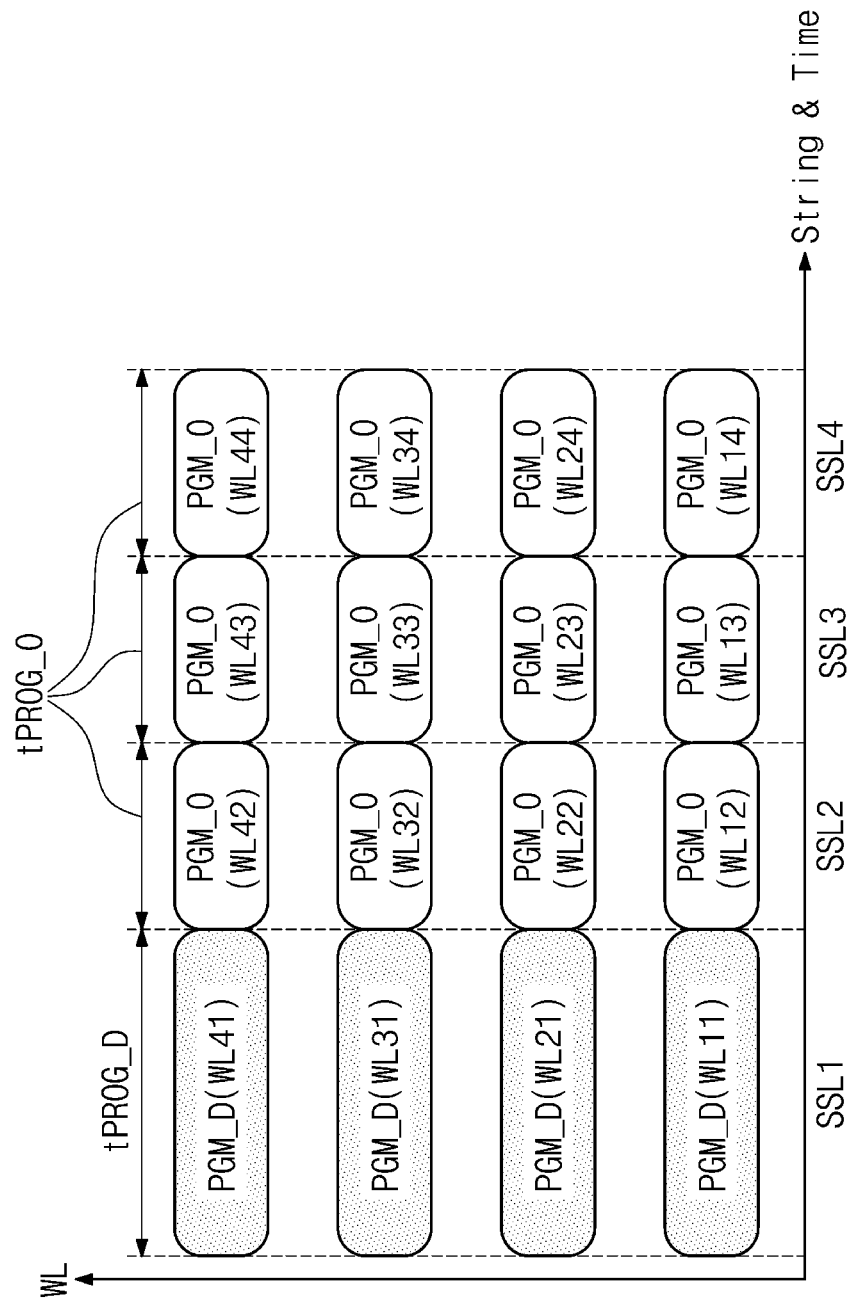
FIG. 10 is a diagram illustrating how a performance is improved as a leading word line is selected, according to an embodiment of the inventive concept.

FIG. 10 is a diagram illustrating how a performance is improved as a leading word line is selected, according to an embodiment of the inventive concept. Program times corresponding to the case where a leading word line is designated for each semiconductor layer are illustrated in FIG. 10.

For word lines WL1$j$ (j being 1, 2, 3, and 4), the word line WL11 corresponding to the first string selection line SSL1 may be designated as a leading word line. For word lines WL2$j$, the word line WL21 may be designated as a leading word line; for word lines WL3$j$, the word line WL31 may be designated as a leading word line; and for word lines WL4$j$, the word line WL41 may be designated as a leading word line.

In the case where an address provided for a program operation corresponds to the word line WL11, the storage controller 110 may determine the word line WL11 as a leading word line. The storage controller 110 may control the nonvolatile memory device 120 such that selected memory cells are programmed in a default program mode PGM_D. In the default program mode PGM_D, memory cells may be programmed to have an allowed maximum margin. Accordingly, in the default program mode PGM_D, the number of program loops does not decrease, or a verify voltage pulse does not be skipped. A program time tPROG_D may be taken when the default program mode PGM_D is applied. In addition, in the default program mode PGM_D, the storage controller 110 may be provided with program result information from the nonvolatile memory device 120. The storage controller 110 may update the parameter table 224 of FIG. 3, for example, by using the program result information.

Then, in the case where a next address provided for a program operation corresponds to the word line WL12, the storage controller 110 may determine the word line WL12 as a following word line. The storage controller 110 may control the nonvolatile memory device 120 such that selected memory cells are programmed in an optimal program mode PGM_O. In the optimal program mode PGM_O, memory cells may be programmed depending on the optimal program parameter updated in the parameter table 224. That is, in the optimal program mode PGM_O, the number of program loops may be minimized within a range where the reliability of memory cells is maintained at a given level. Alternatively, in the optimal program mode PGM_O, there may be skipped the application of the program verify pulse that is determined as being unnecessary within a range where the reliability of memory cells is maintained at the given level. In addition, in the optimal program mode PGM_O, within the range where the reliability of memory cells is maintained at the given level, a start voltage level of a program pulse may increase, or an end voltage level thereof may decrease. Accordingly, when the optimal program mode PGM_O is applied, an optimal program time tPROG_O of memory cells may be shorter than the default program time tPROG_D.

The optimal program mode PGM_O applied to the following word line WL12 may be identically applied to the remaining following word lines WL13 and WL14 present in the same layer as the leading word line WL11.

For the word lines WL2$j$ (j being 1, 2, 3, and 4), memory cells corresponding to the word line WL21 may be programmed depending on the default program mode PGM_D. When the program operation of the default program mode PGM_D is completed, program result information may be provided to the storage controller 110. The storage controller 110 may determine an optimal program parameter depending on the program result information. Then, the storage controller 110 may program memory cells connected to the following word lines WL22, WL23, and WL24 in the optimal program mode PGM_O.

For the word lines WL3$j$ (j being 1, 2, 3, and 4), memory cells corresponding to the word line WL31 may be programmed in the default program mode PGM_D. The storage controller 110 may generate an optimal program parameter depending on the program result information. Then, the storage controller 110 may program memory cells connected to the following word lines WL32, WL33, and WL34 in the optimal program mode PGM_O.

For the word lines WL4$j$ (j being 1, 2, 3, and 4), memory cells corresponding to the word line WL41 may be programmed in the default program mode PGM_D. The storage controller 110 may generate an optimal program parameter depending on the program result information. Then, the storage controller 110 may program memory cells connected to the following word lines WL42, WL43, and WL44 in the optimal program mode PGM_O.

The advantages of the inventive concept are described above with reference to an embodiment where one leading word line is designated for each layer.

Figure 11:
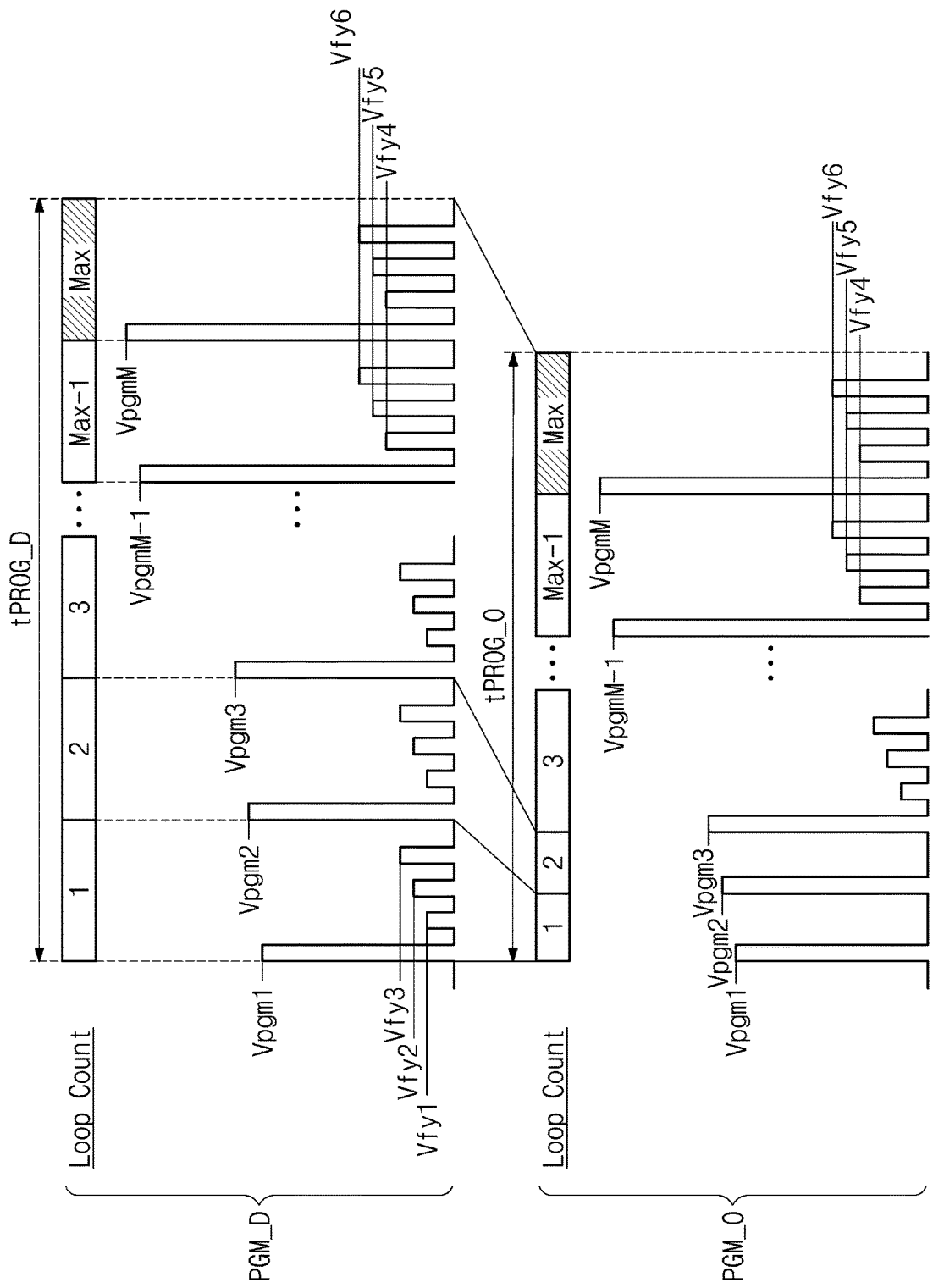
FIG. 11 is a timing diagram illustrating an example of a default program mode and an optimal program mode.

FIG. 11 is a timing diagram illustrating an example of a default program mode and an optimal program mode. The optimal program mode PGM_O where the application of some verify voltage pulses is skipped is illustrated in FIG. 11.

In the default program mode PGM_D, verify voltage pulses allocated for each program loop may be applied without skip. In a program loop corresponding to each of loop counts of 1, 2, and 3, verify voltage pulses Vfy1, Vfy2, and Vfy3 may be applied. As described above, verify voltage pulses allocated to each program loop may be sequentially applied without skip. In a program loop corresponding to the last loop count Max, verify voltage pulses Vfy5, Vfy6, and Vfy7 may be applied. The default program time tPROG_D may be taken to program memory cells in the default program mode PGM_D.

In contrast, in the optimal program mode PGM_O, verify voltage pulses may be skipped in some program loops. For example, in an initial program loop where most memory cells may not be programmed to a target state(s), a verify operation for determining a program pass may be skipped and started after a certain program loop. In an embodiment, in a program loop corresponding to each of the loop counts of 1 and 2, the application of the verify voltage pulses Vfy1, Vfy2, and Vfy3 may be skipped. The verify voltage pulses Vfy1, Vfy2, and Vfy3 may be applied from a program loop corresponding to the loop count of 3. Although not illustrated in FIG. 11, this way to apply verify voltage pulses may be applied to respective target states. Accordingly, the optimal program time tPROG_O taken to program memory cells in the optimal program mode PGM_O is be shorter than the default program time tPROG_D.

The optimal program mode PGM_O where the application of verify voltage pulses is skipped is described above, but the inventive concept is not limited thereto. For example, a level of a start program pulse Vpgm1 used in the optimal program mode PGM_O may be higher than in the default program mode PGM_D. Alternatively, a level of an end program pulse VpgmM used in the optimal program mode PGM_O may be lower than in the default program mode PGM_D. However, this way to set a parameter in the optimal program mode PGM_O may be applied within an allowed margin or reliability.

Figure 12:
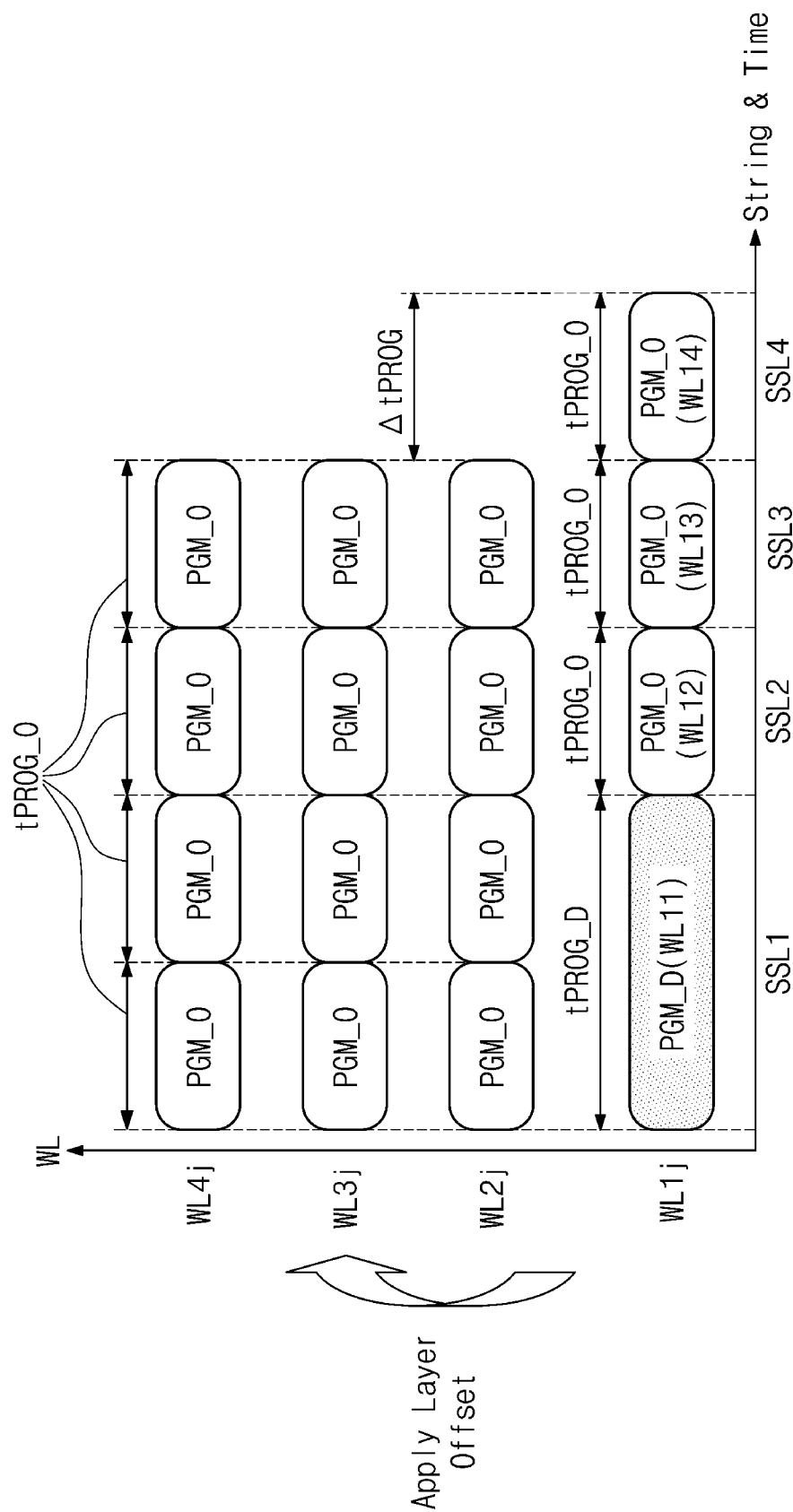
FIG. 12 is a diagram illustrating how a performance is improved as a leading word line is selected, according to another embodiment of the inventive concept.

FIG. 12 is a diagram illustrating how a performance is improved as a leading word line is selected, according to another embodiment of the inventive concept. Referring to FIGS. 6 and 12, a leading word line may be designated in only one of layers included in a memory block.

In an embodiment, the word line WL1*j* (j being 1, 2, 3, and 4) present in the lowermost layer may be designated as a leading word line. The remaining word lines WL12, WL13, and WL14 present in the same layer as the leading word line WL11 are designated as following word lines. In addition, word lines WL2*j*, WL3*j*, and WL4*j* present in the remaining layers may be designated as following word lines.

When the leading word line WL11 is selected in a program operation, the storage controller 110 may control the nonvolatile memory device 120 such that selected memory cells are programmed in the default program mode PGM_D. The program time tPROG_D may be taken when the default program mode PGM_D is applied. In addition, in the default program mode PGM_D, the storage controller 110 may obtain program result information from the nonvolatile memory device 120 and may update the parameter table 224 (refer to FIG. 3) by using the obtained program result information.

Memory cells connected to the following word lines WL12, WL13, and WL14 present in the same layer as the leading word line WL11 may be programmed in the optimal program mode PGM_O. In the optimal program mode PGM_O, memory cells are programmed depending on the optimal program parameter updated in the parameter table 224 of FIG. 3, for example. Accordingly, the optimal program time tPROG_O of the memory cells connected to the following word lines WL12, WL13, and WL14 may be shorter than the default program time tPROG_D. Therefore, the time required for programming the memory cells included in each of the following word lines WL12, WL13 and WL14 may be shorter by ΔtPROG than the time required for programming the word line WL11.

An optimal program parameter to which a layer offset is applied may be set to the following word lines WL2*j*, WL3*j*, and WL4*j* (j being 1, 2, 3, and 4) present in different layers from the leading word line WL11. The optimal program parameter corresponding to the following word lines WL2*j*, WL3*j*, and WL4*j* may be determined by using the layer offset and program result information obtained as the default program mode PGM_D is executed with regard to the leading word line WL11. Here, the layer offset is a value that is obtained in consideration of the vertical layer variability of the three-dimensional memory structure. The layer offset may be applied differently for each layer.

The advantages of the inventive concept are described above with reference to an embodiment where one leading word line is designated for each memory block.

Figure 13:
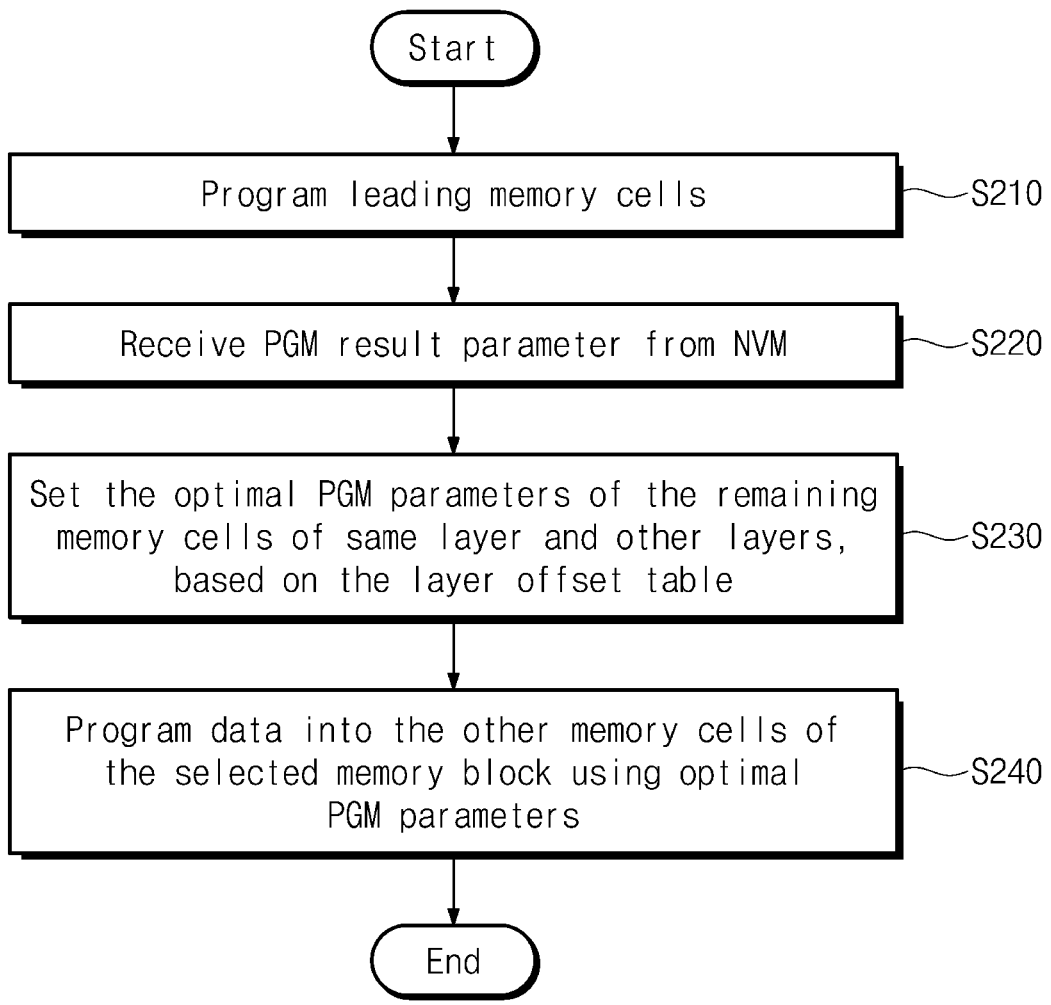
FIG. 13 is a flowchart illustrating a program method in a leading word line structure of FIG. 12.

FIG. 13 is a flowchart illustrating a program method in a leading word line structure of FIG. 12. An operation of the storage device 100 that sets an optimal parameter to which a layer offset is applied will be described with reference to FIGS. 12 and 13.

In operation S210, the storage controller 110 may allow the nonvolatile memory device 120 to program memory cells (hereinafter referred to as "leading memory cells") connected to a selected leading word line WL11. In this case, the storage controller 110 may control the nonvolatile memory device 120 such that the leading memory cells are programmed depending on a default program parameter.

In operation S220, the storage controller 110 may receive program result information about the leading memory cells from the nonvolatile memory device 120. For example, the storage controller 110 may receive the program result information of the leading memory cells corresponding to the leading word line WL11 by using the get feature command. As described above, the program result information may include at least one of the number of programmed cells, threshold voltages of which are a verify voltage level or higher, for each program loop, the number of program loops in which the number of programmed cells, threshold voltages of which are a verify voltage level or higher, exceeds the threshold value TH, and the number of passed program loops for each target state. However, the program result information of the present inventive concept is not limited to the above example.

In operation S230, the storage controller 110 may determine an optimal program parameter corresponding to following word lines WL12, WL13, WL14, WL2*j*, WL3*j*, and WL4*j* (j being 1, 2, 3, and 4) based on the obtained program result information. The optimal program parameter may be determined by the optimal parameter manager 114 included in the flash translation layer 112. In particular, the optimal program parameter of the following word lines WL2*j*, WL3*j*, and WL4*j* present in different layers from the leading word line WL11 may be set based on a layer offset.

In operation S240, the storage controller 110 may program memory cells connected to the following word lines WL12, WL13, WL14, WL2*j*, WL3*j*, and WL4*j*. In this case, the optimal program parameter may be used.

Figure 14A:
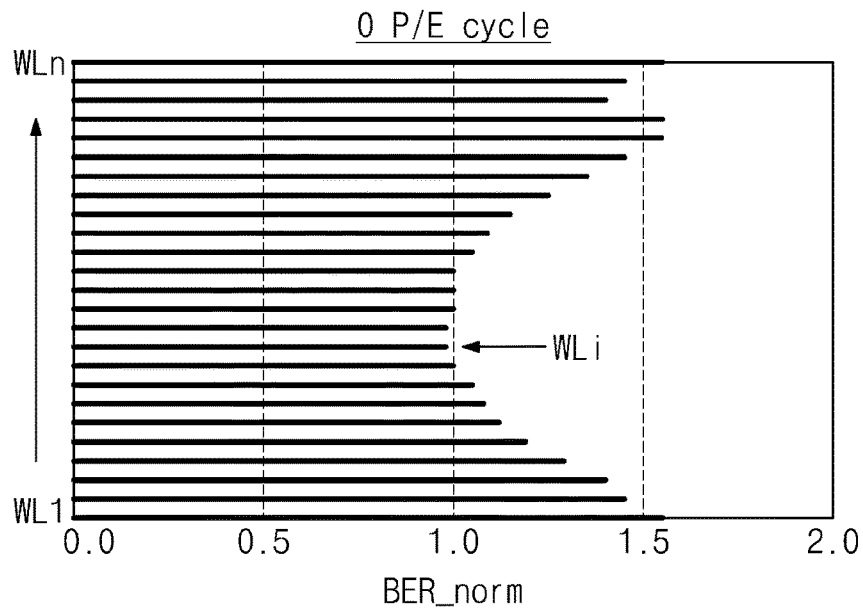
FIGS. 14A and 14B are diagrams for describing a vertical layer variability of a memory block.
Figure 14B:
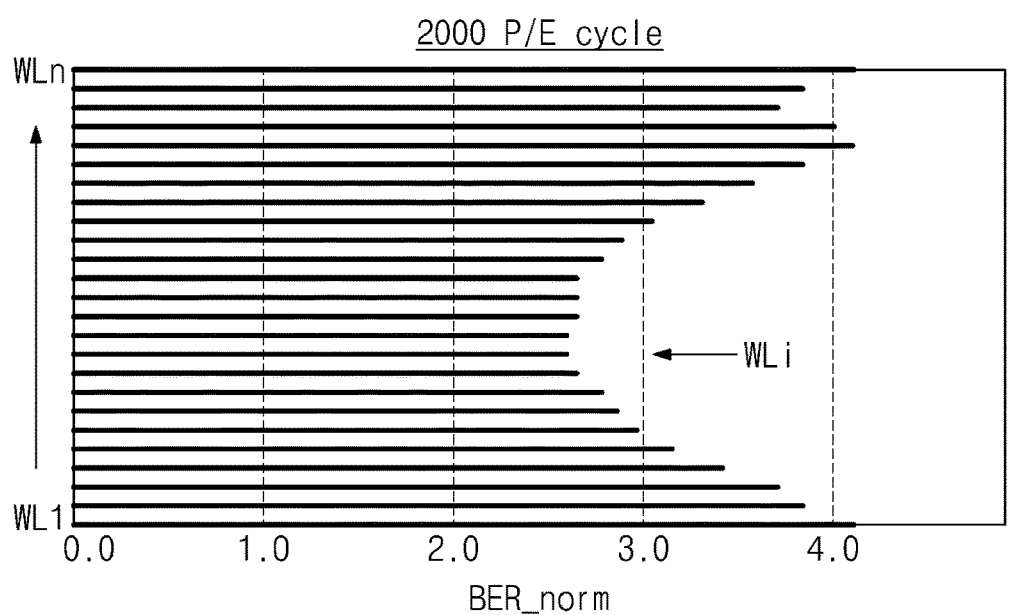

FIGS. 14A and 14B are diagrams for describing a vertical layer variability of a memory block. FIG. 14A shows a bit error rate BER of memory cells for each layer when a program/erase count is "0". FIG. 14B shows the bit error rate BER of memory cells for each layer when a program/erase count is "2000".

Referring to FIG. 14A, when a program/erase count of the nonvolatile memory device 120 is "0", a normalized bit error rate BER_norm indicating an index of reliability for each layer of memory cells is illustrated. In this case, the normalized bit error rate BER_norm of memory cells in a word line layer WL1 adjacent to the ground selection line GSL is shown as exceeding 1.5. In contrast, the normalized bit error rate BER_norm of memory cells in a word line layer WLi at an intermediate position between the ground selection line GSL and the string selection line SSL is shown as 1.0. It is understood from the FIG. 14A that the normalized bit error rate BER_norm increases as a distance from the string selection line SSL decreases. A change of the normalized bit error rate BER_norm for each layer may be uniform.

Referring to FIG. 14B, when a program/erase count of the nonvolatile memory device 120 is "2000", the normalized bit error rate BER_norm indicating an index of reliability for each layer of memory cells is illustrated. The normalized bit error rate BER_norm of the memory cells in the word line layer WL1 adjacent to the ground selection line GSL is shown as exceeding 4.0. Also, the normalized bit error rate BER_norm of memory cells in the word line layer WLi at the intermediate position between the ground selection line GSL and the string selection line SSL is shown as exceeding 2.5. Also, there is a layer where the normalized bit error rate BER_norm increases as a distance from the string selection line SSL decreases and exceeds 4.0. A bit error rate increases as a program/erase count increase, but it is possible to sufficiently infer a vertical layer variability indicating a characteristic change for each layer. It may be understood that the vertical layer variability may be adjusted depending on a program/erase count, an operating temperature, or a process variation.

Figure 15:
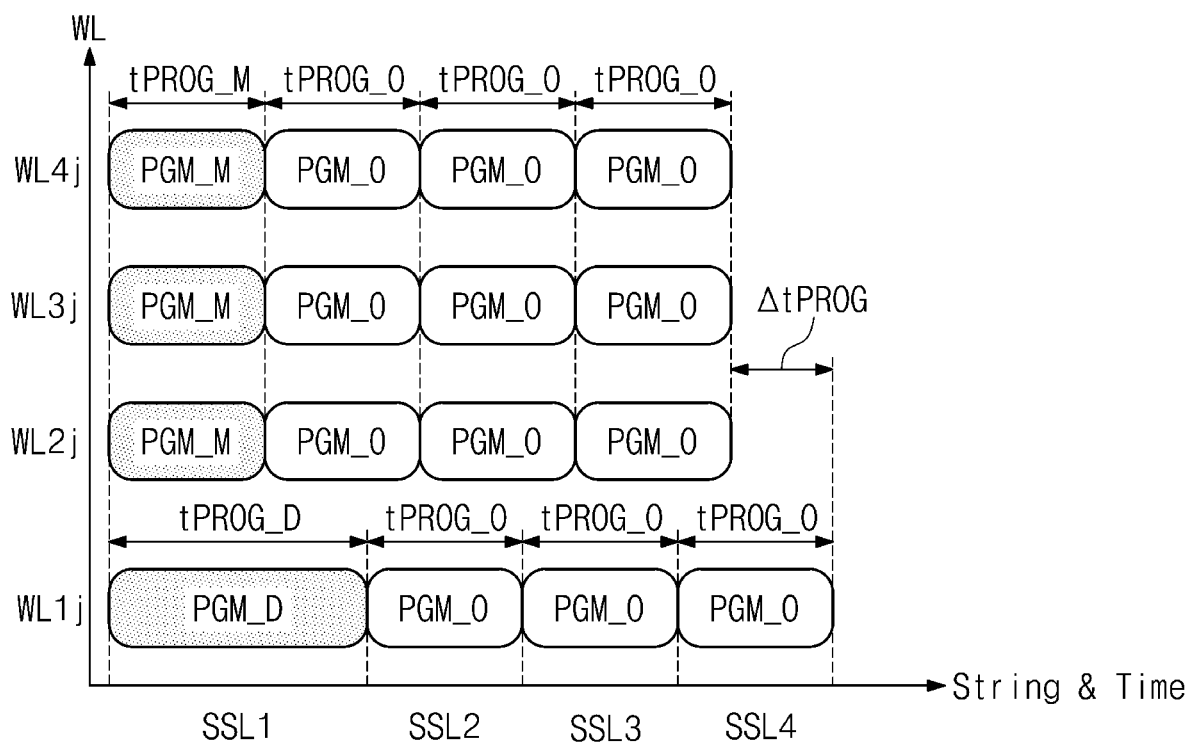
FIG. 15 is a diagram illustrating how a performance is able to be improved as a leading word line is selected, according to another embodiment of the inventive concept.

FIG. 15 is a diagram illustrating how a performance is able to be improved as a leading word line is selected, according to another embodiment of the inventive concept. Referring to FIGS. 6 and 15, a leading word line may be designated for each of layers included in a memory block. However, a default program mode may be applied to a leading word line that is first programmed.

In an embodiment, at least one leading word line may be designated for each layer. However, program result information about memory cells of the leading word line WL11 present in the lowermost layer may be used to set an optimal program parameter of a different layer as well as the following word lines WL12, WL13, and WL14 of the lowermost layer. That is, an optimal program parameter of all memory cells of different layers may be determined by using the program result information about the memory cells of the leading word line WL11 and a layer offset.

However, the embodiment of FIG. 15 may be different from the embodiment of FIG. 12 in that memory cells connected to the leading word lines WL21, WL31, and WL41 of the remaining layers other than the lowermost layer may be programmed depending on an optimal program parameter determined by program result information of the leading word line WL11 in the lowermost layer. In addition, program result information may be obtained from the memory cells thus programmed from each of the following word lines WL12, WL13 and WL14. That is, the memory cells connected to the leading word lines WL21, WL31, and WL41 which are present above the lowermost layer may be programmed depending on the optimal program parameter determined by the program result information of the leading word line WL11 in the lowermost layer, but the program result information is also read from each of the following word lines WL21, WL31 and WL41. This program mode may be called a "mixed program mode PGM_M". In the mixed program mode PGM_M, memory cells of a following word line of a corresponding layer may be programmed by using an optimal program parameter that is adjusted more finely.

Figure 16:
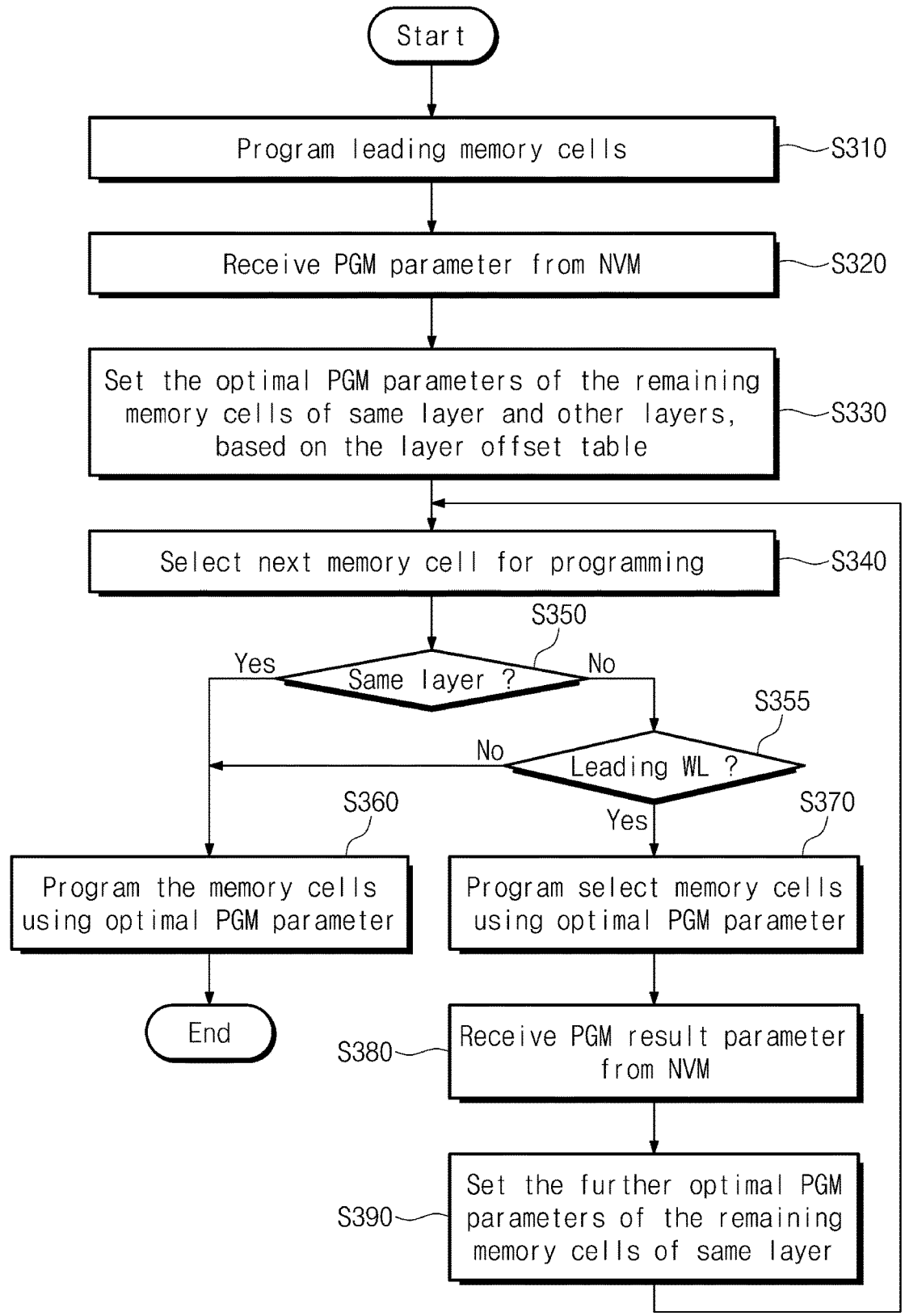
FIG. 16 is a flowchart illustrating a program method in a leading word line structure of FIG. 15.

FIG. 16 is a flowchart illustrating a program method in a leading word line structure of FIG. 15. An operation of the storage device 100 that sets an optimal parameter to which a layer offset is applied will be described with reference to FIGS. 15 and 16.

In operation S310, the storage controller 110 may allow the nonvolatile memory device 120 to program memory cells (hereinafter referred to as "leading memory cells") connected to a selected leading word line WL11. In this case, the storage controller 110 may control the nonvolatile memory device 120 such that the leading memory cells are programmed depending on a default program parameter.

In operation S320, the storage controller 110 may receive program result information about the leading memory cells from the nonvolatile memory device 120.

In operation S330, the storage controller 110 may determine an optimal program parameter for the following word lines WL12, WL13, WL14, WL2j, WL3j, and WL4j (j being 1, 2, 3, and 4) based on the obtained program result information. In particular, an optimal program parameter of the following word lines WL2j, WL3j, and WL4j present in different layers from the leading word line WL11 may be set based on a layer offset.

In operation S340, next memory cells to be programmed following the memory cells connected to the leading word line WL11 may be selected.

In operation S350, the storage controller 110 may determine whether the selected memory cells belong to the same layer as the leading word line WL11. When it is determined that the selected memory cells belong to the same layer as the leading word line WL11 (Yes), the procedure proceeds to operation S360. In contrast, when it is determined that the memory cells selected for a next program operation belong to a different layer from the leading word line WL11 (No), the procedure proceeds to operation S355.

In operation S360, the storage controller 110 may program the memory cells belonging to the same layer as the leading word line WL11 based on the optimal program parameter that is previously set.

In operation S355, the storage controller 110 may determine whether the memory cells selected for the next program operation correspond to a leading word line. When it is determined that the memory cells selected for the next program operation correspond to the leading word line (Yes), the procedure proceeds to operation S370. In contrast, when it is determined that the memory cells selected for the next program operation do not correspond to the leading word line (No), the procedure proceeds to operation S360.

In operation S370, the storage controller 110 may allow the nonvolatile memory device 120 to program memory cells (hereinafter referred to as "leading memory cells") connected to the selected leading word line depending on the optimal program parameter that is previously set.

In operation S380, the storage controller 110 may receive program result information about the leading memory cells from the nonvolatile memory device 120.

In operation S390, the storage controller 110 may determine an optimal program parameter corresponding to the following word lines belonging to the same layer as the memory cells programmed in operation S370, based on the obtained program result information.

Figure 17:
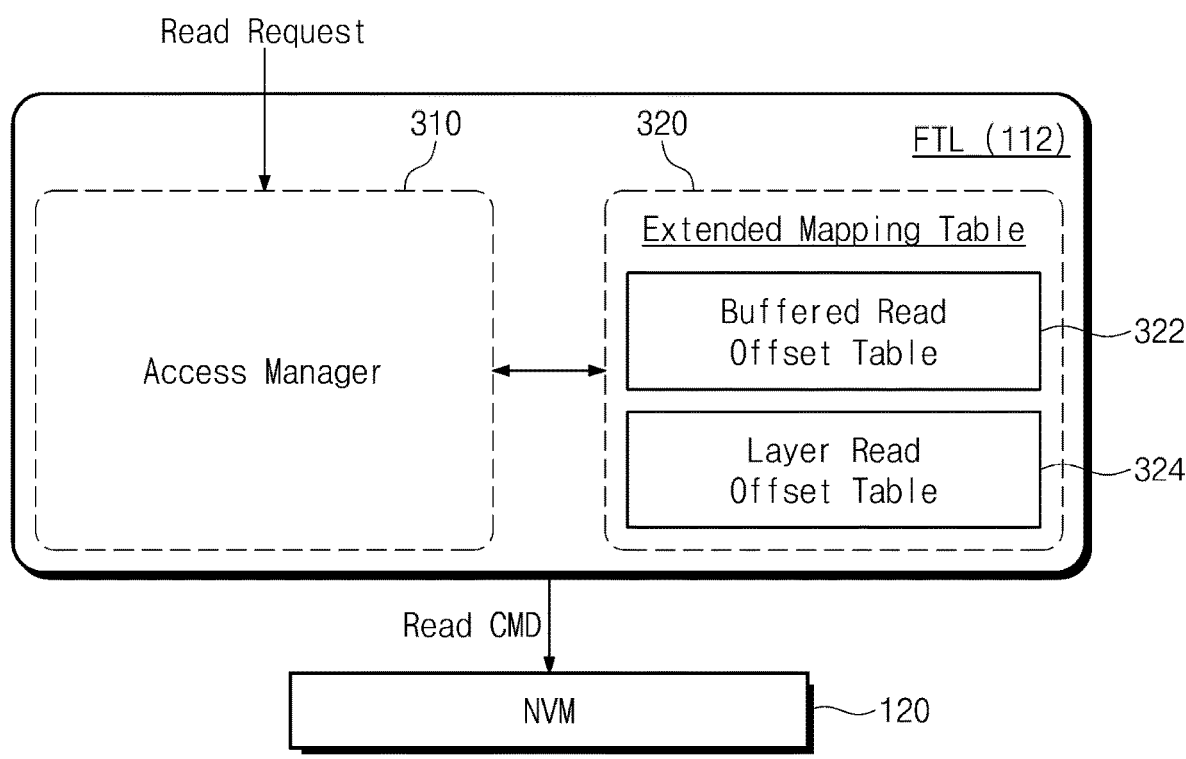
FIG. 17 is a block diagram illustrating a structure of a flash translation layer according to another embodiment.

FIG. 17 is a block diagram illustrating a structure of a flash translation layer (FTL) according to an embodiment. Referring to FIG. 17, the flash translation layer 112 that drives the storage controller 110 includes an access manager 310 and an extended mapping table 320.

The access manager 310 receives a read request from the host and selects memory cells for the purpose of processing the received read request. When an uncorrectable error is detected from data read from the selected memory cells, the access manager 310 may perform a read retry operation that uses an adjusted read parameter. When an error is not detected from data read through the read retry operation or a correctable error is detected from the data, the access manager 310 may determine that the read retry operation succeeds. The access manager 310 may store a read parameter corresponding to a time when the read retry operation succeeds, in a buffered read offset table 322 included in the extended mapping table 320. In an exemplary embodiment, the adjusted read parameter may be a starting parameter for the read retry operation, changing until the read retry operation is determined as succeeding. In this case, the access manager 310 may store the changed parameter of the read retry operation, when determined as succeeding, in the buffered read offset table 322.

After the read retry operation is performed on the selected memory cells of the semiconductor layer, when a read operation is requested with regard to other memory cells of the same semiconductor layer, the access manager 310 may access the other memory cells based on the adjusted read parameter stored in the buffered read offset table 322. After the read retry operation is performed, a read operation may be requested with regard to memory cells of a different layer from a layer where the read retry operation occurs. In this case, the access manager 310 may additionally apply a layer read offset table 324 to the read parameter stored in the buffered read offset table 322 and may access the memory cells of the different layer.

Figure 18:
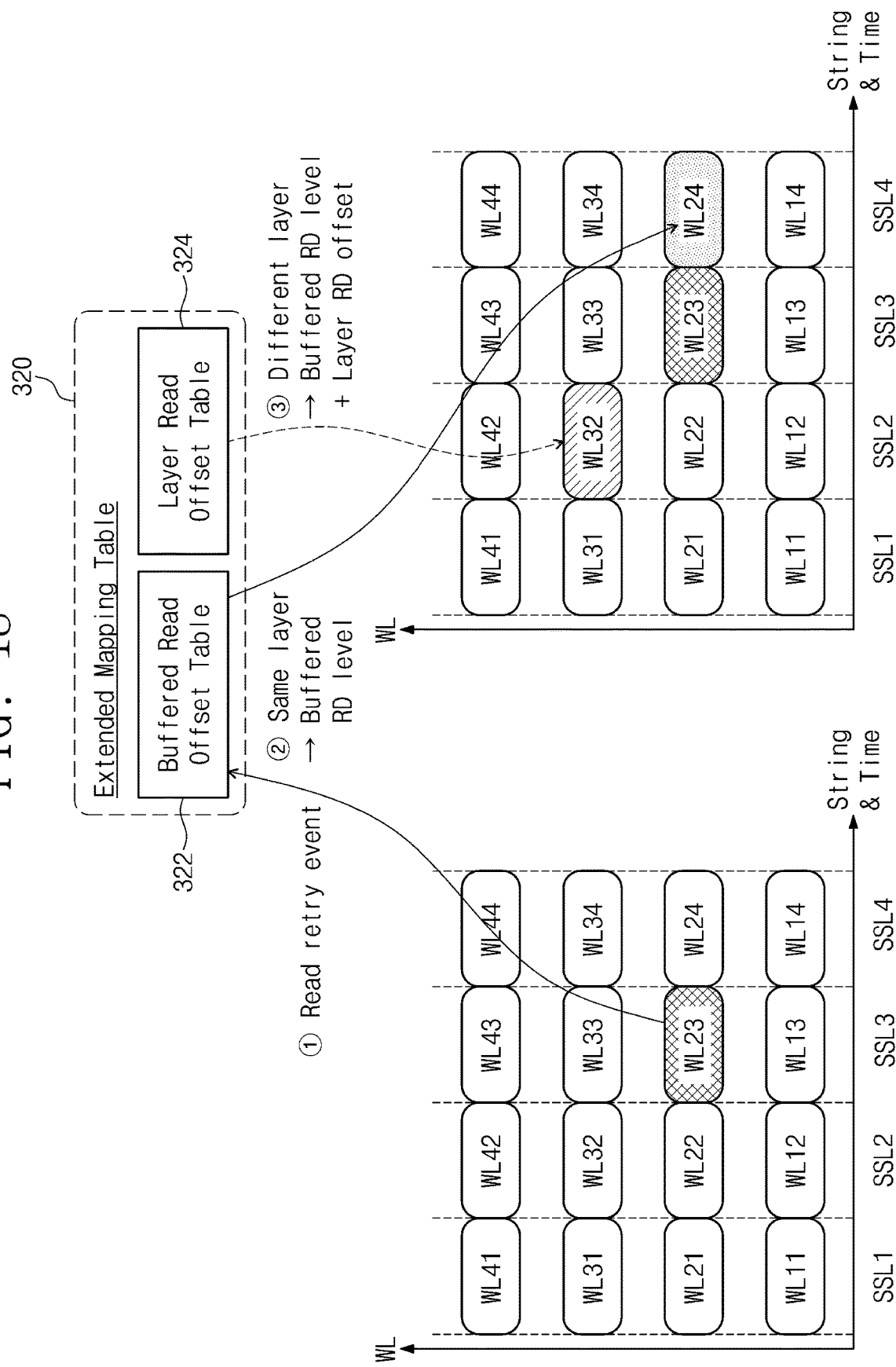
FIG. 18 is a diagram illustrating a read method of a nonvolatile memory device utilizing an extended mapping table of FIG. 17.

FIG. 18 is a diagram illustrating a read method of a nonvolatile memory device utilizing an extended mapping table of FIG. 17. Referring to FIG. 18, it is assumed that a read retry operation occurs in a read operation associated with memory cells of a word line WL23.

When an uncorrectable error occurs in the read operation associated with the memory cells corresponding to the word line WL23, the access manager 310 may apply an adjusted read parameter to the memory cells corresponding to the word line WL23 and may perform a read retry operation using the adjusted read parameter. In the case where the read retry operation succeeds, a read parameter corresponding to a time when the read retry operation succeeds is stored in the buffered read offset table 322. This process is illustrated by an arrow of ①. In an exemplary embodiment, the adjusted read parameter may be a starting read parameter for the read retry operation, changing until the read retry operation is determined as succeeding. In this case, the access manager 310 may store a changed read parameter of the read retry operation, when determined as succeeding, in the buffered read offset table 322. For example, the read parameter may include a read level, and in this case, the starting read parameter may include a starting read level and the changed read parameter includes a changed read level.

Then, when a read operation is requested with regard to memory cells corresponding to a word line WL24, the access manager 310 may determine whether the requested read operation corresponds to the same layer as the layer where the read retry operation is performed. In the example of FIG. 18, the word line WL24 is included in the same layer as the word line WL23 on which the read retry operation is performed. Accordingly, a read operation associated with memory cells corresponding to the word line WL24 may be performed by using the changed read level stored in the buffered read offset table 322 as an optimal read level. This process is illustrated by an arrow of ②.

In addition, a read operation may be requested with regard to memory cells of a word line WL32 corresponding to a different layer from the layer on which the read retry operation is performed. In this case, the access manager 310 may set an optimal read parameter in consideration of both changed read parameter stored in the buffered read offset table 322 and a layer offset stored in the layer read offset table 324. This process is illustrated by an arrow of ③.

Figure 19:
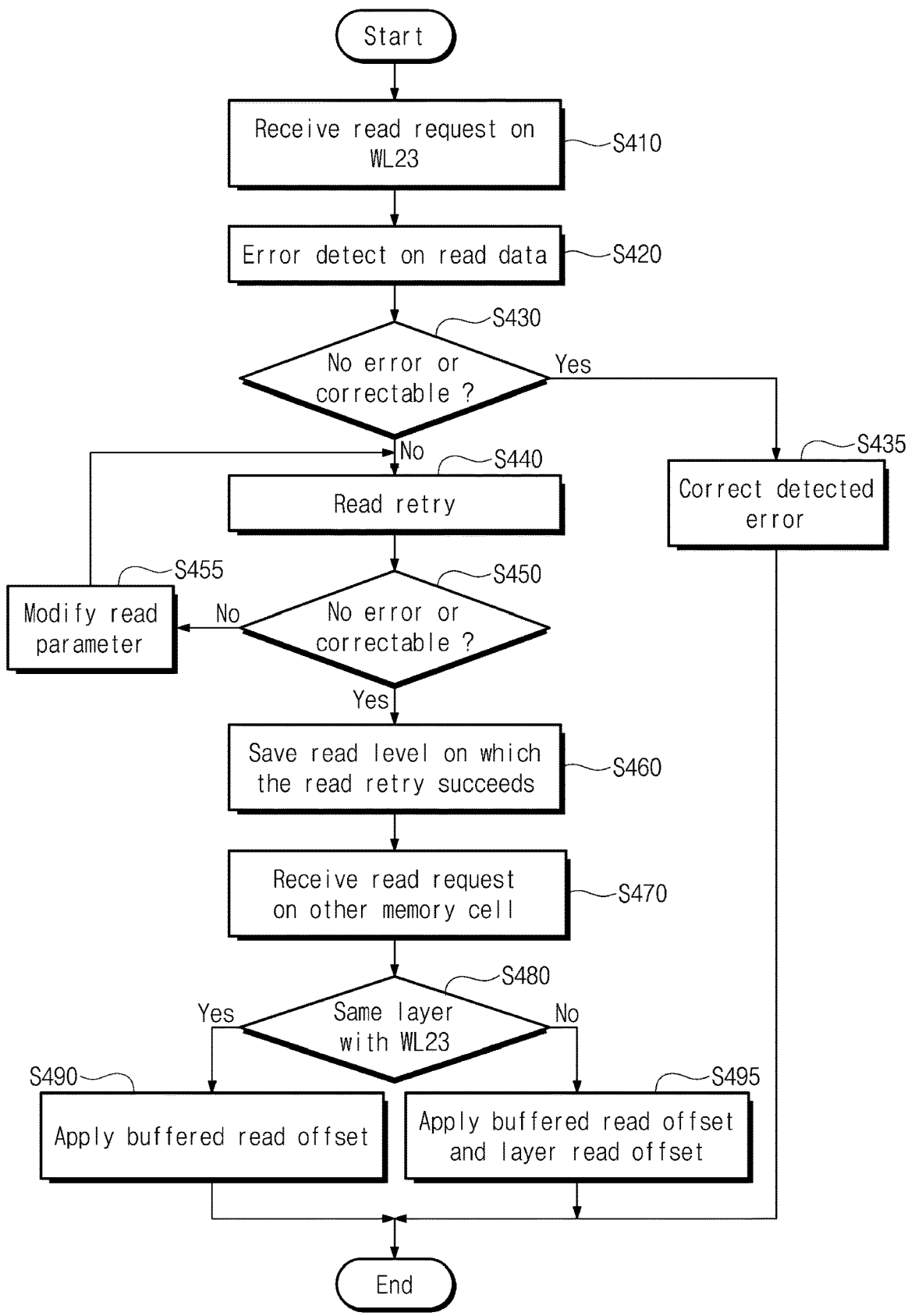
FIG. 19 is a flowchart illustrating a method of setting a parameter in a read operation of FIG. 18.

FIG. 19 is a flowchart illustrating a method of setting a parameter in a read operation of FIG. 18. Referring to FIG. 19, when a read retry operation is performed on a certain word line, the following accesses to the same memory block may be made by using a read parameter newly set through the read retry operation.

In operation S410, the storage controller 110 may receive a read request. In this case, it is assumed that read-requested memory cells are included in memory cells connected to the word line WL23. The storage controller 110 may read data from the read-requested memory cells connected to the word line WL23 in response to the read request.

In operation S420, the storage controller 110 may detect an error of the read data. The error of the read data may be detected through the error correction code circuit 117 (refer to FIG. 2).

In operation S430, the storage controller 110 may determine whether an error is not detected from the read data or whether an error is detected and is correctable. When an error is not detected or a correctable error is detected (Yes), the procedure proceeds to operation S435. However, when an uncorrectable error is detected from the read data (No), the procedure proceeds to operation S440.

In operation S435, the storage controller 110 may correct the error of the read data. The error-corrected data may be sent to the host.

In operation S440, the storage controller 110 may perform the read retry operation. That is, the storage controller 110 may perform a read operation on the memory cells connected to the word line WL23 based on a changed read voltage.

In operation S450, the storage controller 110 may detect an error of the data read through the read retry operation. The storage controller 110 may determine whether an error is not detected or whether an error is detected and is correctable. When an error is not detected or a correctable error is detected (Yes), the procedure proceeds to operation S460. In contrast, when an uncorrectable error is detected (No), the procedure proceeds to operation S455.

In operation S455, the storage controller 110 may adjust (or modify) a read parameter. Afterwards, the procedure proceeds to operation S440 for the purpose of performing a read retry operation based on the adjusted read parameter.

In operation S460, the storage controller 110 may store (or save) a read level (an optimal read level) corresponding to a time when the read retry operation succeeds, in the buffered read offset table 322.

In operation S470, the storage controller 110 receives a next read request.

In operation S480, the storage controller 110 determines whether read-requested memory cells belong to the same layer as the word line WL23 on which the read retry operation is performed. When it is determined that the read-requested memory cells belong to the same layer as the word line WL23 on which the read retry operation is performed (Yes), the procedure proceeds to operation S490. When it is determined that the read-requested memory cells belong to a different semiconductor layer from the word line WL23 on which the read retry operation is performed (No), the procedure proceeds to operation S495.

In operation S490, the selected memory cells may be read based on the updated read level stored in the buffered read offset table 322.

In operation S495, the selected memory cells may be read using an optimal read level set based on both a buffered read offset stored in the buffered read offset table 322 and a layer read offset.

In the case where a read retry operation is performed, a method of preventing an additional read retry operation in the same block is described above.

Figure 20:
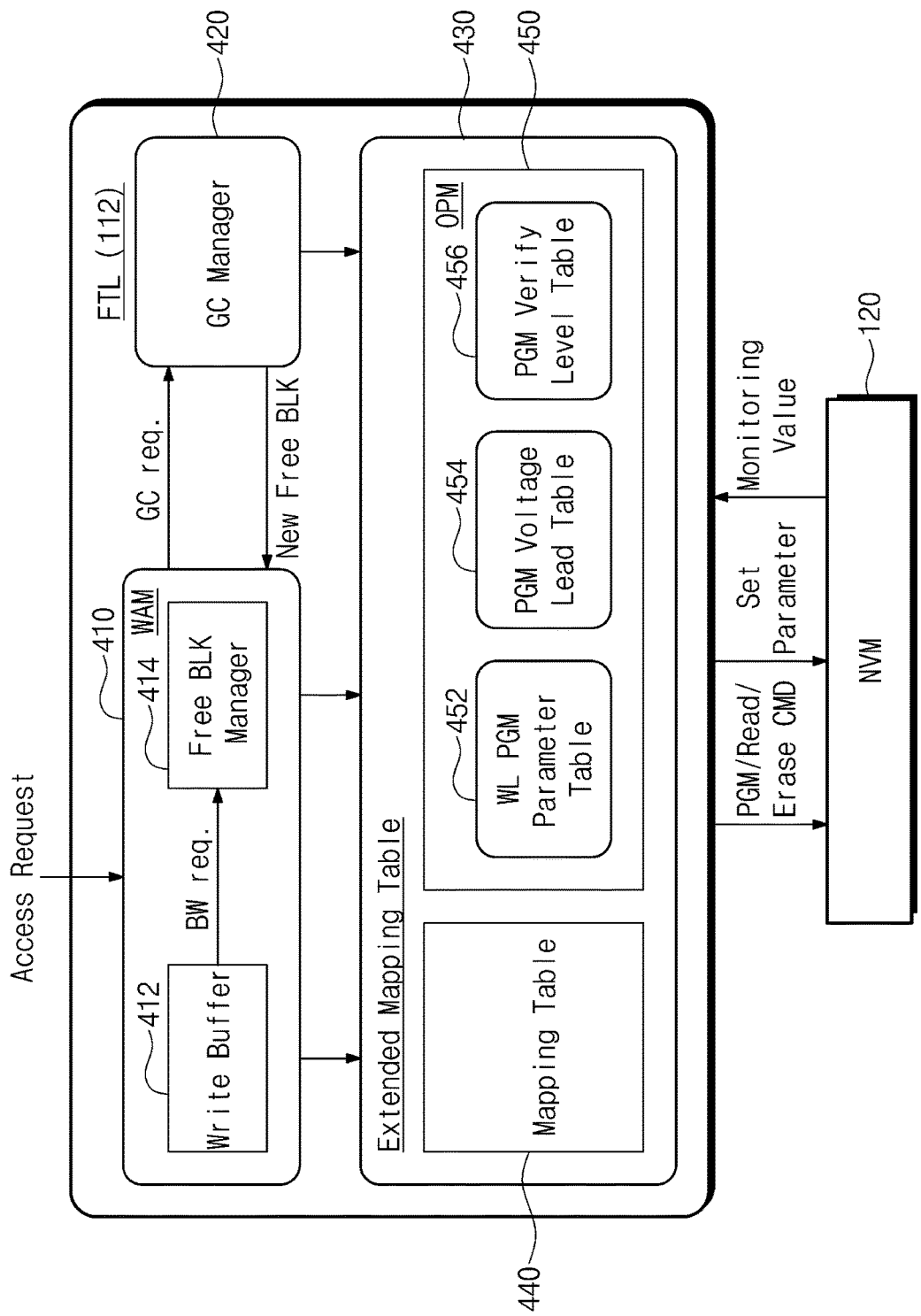
FIG. 20 is a block diagram illustrating a structure of a flash translation layer according to another embodiment of the inventive concept.

FIG. 20 is a block diagram illustrating a structure of a flash translation layer (FTL) according to an embodiment of the inventive concept. Referring to FIG. 20, the flash translation layer 112 includes a word line allocation manager (WAM) 410 and an extended mapping table 430.

The word line allocation manager 410 includes a write buffer 412 and a free block manager 414. A free block refers to a memory block of the nonvolatile memory device 120, which is able to immediately store data provided from the write buffer 412. When the number of memory blocks (i.e., free blocks) is insufficient, the word line allocation manager 410 sends a garbage collection request to a garbage collection manager 420. In response to the garbage collection request, the garbage collection manager 420 performs a garbage collection operation to secure a free block(s).

As described above, a memory block of the inventive concept includes an area where a program speed corresponding to a leading word line is relatively low (i.e., a low-speed access mode) and an area where a program speed corresponding to a following word line is relatively high (i.e., a high-speed access mode).

When a write operation of a large bandwidth is requested, the free block manager 414 may perform a high-speed access mode in which the free block manager 414 writes data of the write buffer 412 in the area corresponding to the following word line of the nonvolatile memory device 120. When a write operation of a small bandwidth is requested, the free block manager 414 may perform a low-speed access mode in which the free block manager 414 writes data of the write buffer 412 in the area corresponding to the leading word line of the nonvolatile memory device 120.

Figure 21:
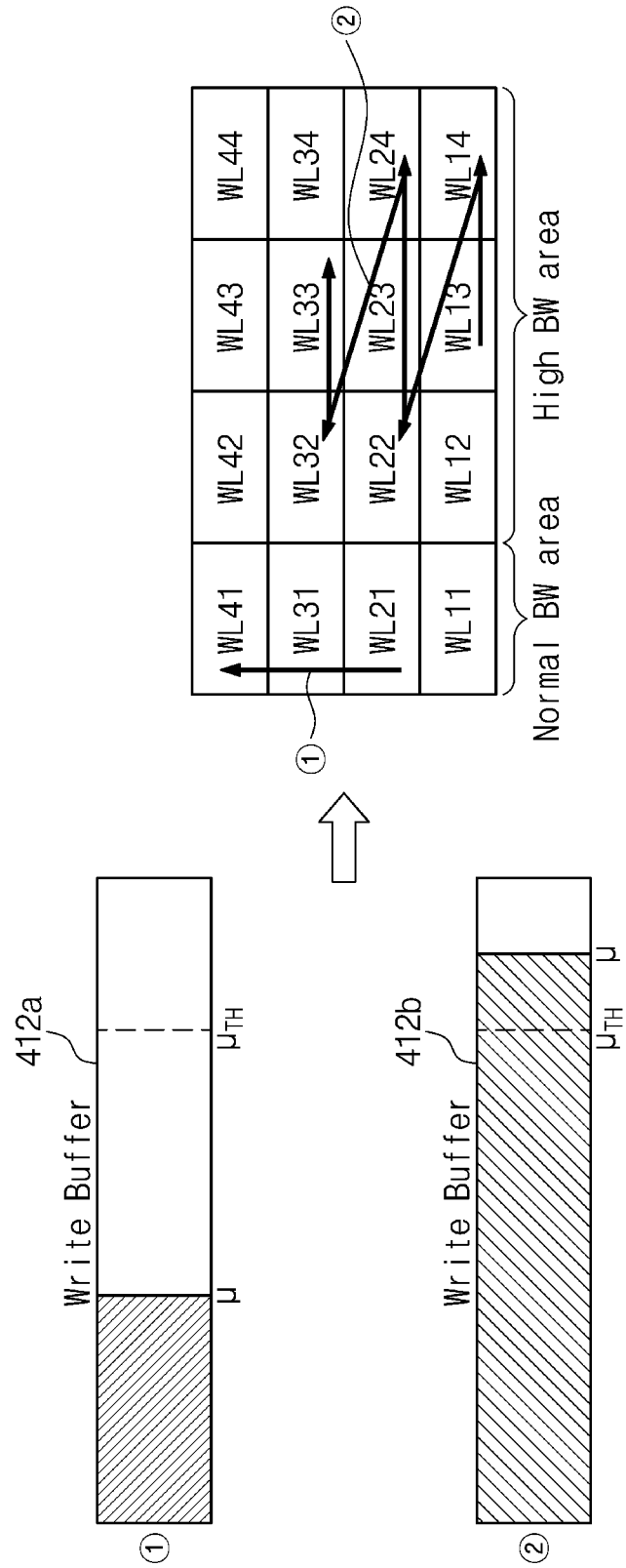
FIG. 21 is a diagram illustrating a method of flushing data to a memory block depending on a state of a write buffer.

FIG. 21 illustrates a method of flushing data to a memory block depending on a state of a write buffer. Referring to FIG. 21, an area of a free block to which buffering data are to be flushed may be determined depending on a utilization rate "$\mu$".

First, when the utilization rate "$\mu$" of the write buffer 412 is smaller than a reference value $\mu_{TH}$, the buffering data are flushed to a normal bandwidth area (①). The normal bandwidth area includes memory cells connected to a leading word line. In contrast, when the utilization rate "$\mu$" of the write buffer 412 is the reference value $\mu_{TH}$ or greater, the buffering data are flushed to a high bandwidth area of a free block (②). The high bandwidth area includes memory cells connected to a following word line.

In addition, data may be selectively stored in the high bandwidth area or the normal bandwidth area of a memory block depending on whether data provided from an application level are hot data or cold data.

According to an embodiment of the inventive concept, as a program or read parameter of memory cells in one memory block is able to be adjusted depending on where a semiconductor layer is positioned in a memory block, an access speed may be improved while the reduction of reliability of a nonvolatile memory device is minimized.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A method of accessing a nonvolatile memory device which includes a memory block where a plurality of semiconductor layers including a plurality of word lines are stacked, the method comprising:
receiving a write request for the memory block;
determining whether the write request corresponds to one or more leading word lines in the memory block;
programming, in response to the write request that is determined as corresponding to the one or more leading word lines, memory cells connected thereto in a first program mode; and
programming, in response to the write request that is determined as corresponding to a following word line of the plurality of word lines, memory cells connected to the following word line in a second program mode,
wherein the second program mode is performed with a second program parameter including at least one of a number of program pulses, a number of program verify pulses, a program start voltage, and a program end voltage that is different from a corresponding first parameter of the first program mode.

2. The method of claim 1, further comprising:
reading program result information of executing the first program mode on the memory cells connected to the one or more leading word lines,
wherein the corresponding first parameter of the first program mode is adjusted based on the program result information to set the second program parameter.

3. The method of claim 2,
wherein the following word line is present in a same semiconductor layer as one of the one or more leading word lines, and
the corresponding first parameter of the first program mode is further adjusted based on a horizontal layer similarity to set the second program parameter.

4. The method of claim 2,
wherein the following word line is present in a different semiconductor layer from a semiconductor layer of one of the one or more leading word lines, and
the corresponding first parameter of the first program mode is further adjusted based on a vertical layer variability to set the second program parameter.

5. The method of claim 2,
wherein the program result information includes at least one of a number of programmed cells, threshold voltages of which are a verify voltage or higher, from among memory cells connected to the one or more leading word lines for each program loop, a number of program loops where a number of programmed cells, threshold voltages of which are a verify voltage or higher, exceeds a reference value (TH), and a number of passed program loops for each target state.

6. The method of claim 1,
wherein a word line of each of the plurality of semiconductor layers of the memory block is designated as a corresponding one of the one or more leading word lines.

7. The method of claim 6,
wherein the word line of each of the plurality of semiconductor layers is first accessed in each of the plurality of semiconductor layers.

8. The method of claim 1,
wherein only one of the plurality of word lines included in the memory block is designated as the one leading word line.

9. The method of claim 8,
wherein the one leading word line corresponds to a word line that is first accessed in the memory block.

10. A storage device comprising:
a nonvolatile memory device including a memory block where a plurality of semiconductor layers are stacked; and
a storage controller configured to:

classify and manage a plurality of word lines formed in the plurality of semiconductor layers into one or more leading word lines and a following word line of each of the one or more leading word lines, program memory cells connected to the one or more leading word lines in a first program mode, generate a second program parameter from program result information obtained from the programming of the memory cells connected to the one or more leading word lines in the first program mode, and program memory cells connected to the following word line in a second program mode with the second program parameter, wherein the second program parameter includes a value obtained by adjusting at least one of a number of program pulses, a number of program verify pulses, a program start voltage, and a program end voltage of a first program parameter used in the first program mode based on the program result information.

11. The storage device of claim 10, wherein the storage controller is configured to obtain program result information from the nonvolatile memory device.

12. The storage device of claim 11, wherein the storage controller is configured to provide the second program parameter to the nonvolatile memory device.

13. The storage device of claim 10, wherein a word line of each of the semiconductor layers of the memory block is designated as a corresponding one of the one or more leading word lines.

14. The storage device of claim 10, wherein only one of the plurality of word lines included in the memory block is designated as the one leading word line.

15. The storage device of claim 14, wherein, when the following word line is present in a semiconductor layer different from a semiconductor layer of one of the one or more leading word lines, the storage controller is configured to further adjust the at least one of a number of program pulses, a number of program verify pulses, a program start voltage, and a program end voltage of the first program parameter to set the second program parameter of the following word line based on a vertical layer similarity, and wherein, when the following word line is present in a same semiconductor layer as a semiconductor layer of one of the one or more leading word lines, the storage controller is configured to further adjust the at least one of a number of program pulses, a number of program verify pulses, a program start voltage, and a program end voltage of the first program parameter to set the second program parameter of the following word line based on a horizontal layer variability.

16. A storage device comprising:
a nonvolatile memory device including a memory block with a plurality of semiconductor layers stacked on each other; and
a storage controller including:
a word line monitor configured to control the nonvolatile memory device such that for an access request to one or more leading word lines of the memory block, memory cells connected thereto are programmed in a first program mode and for an access request to a following word line of each of the one or more leading word lines, memory cells connected thereto are programmed in a second program mode; and
a second parameter manager configured to generate a second program parameter for the second program mode from program result information provided as a result of executing the first program mode.

17. The storage device of claim 16, wherein the word line monitor is configured to designate a word line first selected in the memory block as the one leading word line.

18. The storage device of claim 16, wherein the word line monitor is configured to designate a word line of each of the plurality of semiconductor layers of the memory block as a corresponding one of the one or more leading word lines.

19. The storage device of claim 18, wherein the storage controller is configured to:
select the one or more leading word lines in response to the access request corresponding to a low-speed access mode lower than a reference access speed; and
select the following word line in response to the access request corresponding to a high-speed access mode equal to or higher than the reference access speed.

20. The storage device of claim 19, wherein the storage controller further includes a write buffer,
wherein the word line monitor is configured to perform a flush operation in which data stored in the write buffer are programmed in the memory block, depending on a utilization rate of the write buffer, and
wherein, when the utilization rate is lower than a reference value, the word line monitor is configured to select the one or more leading word lines for the flush operation.

* * * * *